US010770456B2

(12) United States Patent
Yoshida et al.

(10) Patent No.: US 10,770,456 B2
(45) Date of Patent: Sep. 8, 2020

(54) SEMICONDUCTOR DEVICE

(71) Applicant: FUJI ELECTRIC CO., LTD., Kanagawa (JP)

(72) Inventors: Soichi Yoshida, Matsumoto (JP); Hiroshi Miyata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 54 days.

(21) Appl. No.: 16/258,480

(22) Filed: Jan. 25, 2019

(65) Prior Publication Data

US 2019/0157264 A1    May 23, 2019

Related U.S. Application Data

(63) Continuation of application No. PCT/JP2018/005312, filed on Feb. 15, 2018.

(30) Foreign Application Priority Data

Feb. 15, 2017  (JP) ................................. 2017-026386

(51) Int. Cl.
*H01L 27/07*   (2006.01)
*H01L 29/739*  (2006.01)
(Continued)

(52) U.S. Cl.
CPC .... *H01L 27/0716* (2013.01); *H01L 21/26506* (2013.01); *H01L 29/0615* (2013.01);
(Continued)

(58) Field of Classification Search
None
See application file for complete search history.

(56) References Cited

U.S. PATENT DOCUMENTS 6,399,998 B1 * 6/2002 Chang ................. H01L 29/1095
                                                        257/139
10,644,141 B2 * 5/2020 Leendertz ........... H01L 29/7395
(Continued)

FOREIGN PATENT DOCUMENTS

JP    2008205015 A    9/2008
JP    2012043890 A    3/2012
(Continued)

OTHER PUBLICATIONS

Extended European Search Report for counterpart European Application No. 18754605.6, issued by the European Patent Office dated Aug. 5, 2019.
(Continued)

*Primary Examiner* — Seahvosh Nikmanesh

(57) ABSTRACT

A semiconductor device including a semiconductor substrate is provided. The semiconductor substrate includes a transistor region, and the transistor region includes a drift region, a plurality of trench portions, a plurality of emitter regions and a plurality of contact regions, and an accumulation region provided between the drift region and the plurality of emitter regions in a depth direction, and having a higher first-conductivity-type doping concentration than the drift region. A first outermost contact region is an outermost one of the plurality of contact regions in a direction parallel to the first direction, and a length of the first outermost contact region in the first direction is longer than a length in the first direction of one contact region of the plurality of contact regions other than the first outermost contact region, and the accumulation region terminates at a position below the first outermost contact region.

17 Claims, 10 Drawing Sheets

(51) Int. Cl.

| | | |
|---|---|---|
| *H01L 29/861* | (2006.01) | |
| *H01L 29/10* | (2006.01) | |
| *H01L 29/417* | (2006.01) | |
| *H01L 29/08* | (2006.01) | |
| *H01L 29/78* | (2006.01) | |
| *H01L 29/40* | (2006.01) | |
| *H01L 29/868* | (2006.01) | |
| *H01L 29/423* | (2006.01) | |
| *H01L 29/32* | (2006.01) | |
| *H01L 29/06* | (2006.01) | |
| *H01L 21/265* | (2006.01) | |

(52) U.S. Cl.
CPC ........ *H01L 29/0696* (2013.01); *H01L 29/083* (2013.01); *H01L 29/0804* (2013.01); *H01L 29/0834* (2013.01); *H01L 29/1004* (2013.01); *H01L 29/1095* (2013.01); *H01L 29/32* (2013.01); *H01L 29/404* (2013.01); *H01L 29/407* (2013.01); *H01L 29/417* (2013.01); *H01L 29/41708* (2013.01); *H01L 29/4238* (2013.01); *H01L 29/7397* (2013.01); *H01L 29/78* (2013.01); *H01L 29/861* (2013.01); *H01L 29/868* (2013.01); *H01L 29/8611* (2013.01)

(56) References Cited

U.S. PATENT DOCUMENTS

| | | | |
|---|---|---|---|
| 2008/0197379 A1 | 8/2008 | Aono | |
| 2012/0043581 A1 | 2/2012 | Koyama | |
| 2014/0117367 A1* | 5/2014 | Blanchard | ........... H01L 29/7803 257/66 |
| 2015/0021658 A1 | 1/2015 | Lee | |
| 2015/0144995 A1 | 5/2015 | Takahashi | |
| 2016/0329323 A1 | 11/2016 | Iwasaki | |
| 2017/0018547 A1 | 1/2017 | Naito | |
| 2017/0018636 A1 | 1/2017 | Naito | |
| 2018/0082996 A1 | 3/2018 | Naito | |
| 2018/0108737 A1* | 4/2018 | Naito | ...................... H01L 29/32 |
| 2018/0108738 A1* | 4/2018 | Naito | .................. H01L 29/1095 |
| 2018/0158815 A1 | 6/2018 | Onozawa | |
| 2018/0182754 A1 | 6/2018 | Naito | |
| 2018/0286943 A1* | 10/2018 | Naito | .................. H01L 29/0653 |
| 2018/0337233 A1* | 11/2018 | Naito | ............... H01L 29/66545 |
| 2018/0350961 A1* | 12/2018 | Naito | ................ H01L 29/66348 |
| 2018/0350962 A1* | 12/2018 | Naito | ...................... H01L 29/36 |
| 2018/0366578 A1* | 12/2018 | Naito | ................ H01L 29/66348 |
| 2019/0019861 A1* | 1/2019 | Naito | .................. H01L 29/0619 |
| 2019/0027591 A1* | 1/2019 | Naito | .................... H01L 29/083 |
| 2019/0051739 A1* | 2/2019 | Naito | .................. H01L 29/1095 |
| 2019/0074367 A1* | 3/2019 | Naito | .................. H01L 29/4236 |
| 2019/0109131 A1* | 4/2019 | Naito | .................. H01L 29/0696 |
| 2019/0123136 A1* | 4/2019 | Lee | ...................... H01L 29/401 |
| 2019/0148532 A1* | 5/2019 | Naito | .................. H01L 27/0716 257/330 |
| 2019/0157264 A1* | 5/2019 | Yoshida | .............. H01L 29/0615 |

FOREIGN PATENT DOCUMENTS

| | | |
|---|---|---|
| JP | 2015103697 A | 6/2015 |
| JP | 2017010975 A | 1/2017 |
| WO | 2017099095 A1 | 6/2017 |
| WO | 2017141998 A1 | 8/2017 |
| WO | 2017155122 A1 | 9/2017 |

OTHER PUBLICATIONS

International Search Report for International Patent Application No. PCT/JP2018/005312, issued by the Japan Patent Office dated May 15, 2018.

* cited by examiner

SEMICONDUCTOR DEVICE

The contents of the following Japanese patent application(s) are incorporated herein by reference: No. 2017-026386 filed in JP on Feb. 15, 2017, and PCT/JP2018/005312 filed on Feb. 15, 2018.

BACKGROUND

Technical Field

The present invention relates to a semiconductor device.

Conventionally, an N type charge storage layer has been provided in a region of an insulated gate bipolar transistor (hereinafter, IGBT) (see Patent document 1, for example).

Patent document 1: Japanese Patent Application Publication No. 2008-205015

The charge storage layer can be formed, for example, by ion implantation of phosphorus from the front surface of the semiconductor substrate. The target area for the phosphorus ion implantation can be limited, for example, by use of a mask composed of photoresist. However, there are cases where the end portion of the mask is not always formed perpendicularly to the front surface of the semiconductor substrate, so that the upper surface of the end portion sags downward and the end portion expands horizontally (so called a mask sag occurs). Also, there are cases where the mask pattern is formed off a predetermined position. In such a case, there are cases where the charge storage layer is formed in the semiconductor substrate at a shallower position than a predetermined position, so that a P type region exposed on the front surface of the semiconductor substrate may be turned into an N type region.

SUMMARY

A first aspect of the present invention provides a semiconductor device. The semiconductor device may include a semiconductor substrate. The semiconductor substrate may include a transistor region. The transistor region may include a first-conductivity-type drift region, a plurality of trench portions, a plurality of first-conductivity-type emitter regions and a plurality of second-conductivity-type contact regions and an accumulation region. The plurality of trench portions may extend from a front surface of the semiconductor substrate in a depth direction to reach the drift region, and extend in a first direction on the front surface. The plurality of emitter regions and the plurality of contact regions may be provided above the drift region. The plurality of emitter regions and the plurality of contact regions may each have an upper surface exposed on the front surface. The plurality of emitter regions and the plurality of contact regions may be alternately arranged next to each other in a first direction between two adjacent trench portions of the plurality of trench portions. The accumulation region may be provided between the drift region and the plurality of emitter regions in the depth direction. The accumulation region may have a higher first-conductivity-type doping concentration than the drift region. The length of the first outermost contact region in the first direction may be longer than that of one contact region of the plurality of contact regions other than the first outermost contact region. The first outermost contact region may be an outermost one of the plurality of contact regions in a direction parallel to the first direction. The accumulation region may terminate at a position below the first outermost contact region.

The accumulation region may extend in the direction parallel to the first direction, and may terminate before reaching a middle position of the first outermost contact region in the first direction.

The length of the first outermost contact region in the first direction may be 10 times or more longer than the length in the first direction of one contact region of the plurality of contact regions other than the first outermost contact region.

The semiconductor device may further comprise an interlayer dielectric film. The interlayer dielectric film may be provided on the front surface of the semiconductor substrate. A contact hole may be provided in the interlayer dielectric film. The contact hole may be provided on the plurality of contact regions and the plurality of emitter regions and extend in the first direction to a region above the first outermost contact region.

The semiconductor substrate may include a base region. The base region may be positioned more outside than the first outermost contact region in a direction parallel to the first direction. The base region may have a lower second-conductivity-type doping concentration than the first outermost contact region. The length of the base region in the first direction may be 10 times or more longer than the length in the first direction of the one contact region of the plurality of contact regions other than the first outermost contact region.

The semiconductor substrate may include a diode region. The diode region may be in direct contact with the transistor region in a second direction orthogonal to the first direction in the front surface of the semiconductor substrate. The diode region may have a boundary dummy trench portion. The boundary dummy trench portion may be a different trench portion than the plurality of trench portions and positioned in a boundary region between the transistor region and the diode region. The boundary dummy trench portion may have a dummy conductive portion to receive an emitter potential fed thereto. The plurality of trench portions may include a plurality of dummy trench portions and a plurality of gate trench portions. The plurality of dummy trench portions may each have a dummy conductive portion to receive the emitter potential fed thereto. The plurality of gate trench portions may each have a gate conductive portion to receive a gate potential fed thereto. The accumulation region may extend in the second direction across the transistor region and the diode region. The accumulation region may terminate in the boundary dummy trench portion. Alternatively, the accumulation region may terminate in a region between the boundary dummy trench portion and a first dummy trench portion of the plurality of dummy trench portions that is the closest to the boundary dummy trench portion.

The semiconductor substrate may further include a second-conductivity-type expansion contact region in a boundary mesa region between the boundary dummy trench portion and the first dummy trench portion. The expansion contact region may not include the plurality of emitter regions. The expansion contact region may extend longer than the plurality of contact regions in the direction parallel to the first direction.

The drift region may have a first defect region. The first defect region may be positioned closer to the accumulation region than to the back surface of the semiconductor substrate in the depth direction. The first defect region may extend across the diode region and a part of the transistor region in the direction parallel to the second direction. The first defect region may be designed to shorten a lifetime of a carrier.

The diode region of the semiconductor substrate may have a high-concentration contact region. The high-concentration contact region may be provided, in the depth direction, at a shallower position than the plurality of contact regions. The high-concentration contact region may have a higher second-conductivity-type doping concentration than the plurality of contact regions.

The semiconductor substrate may include a base region. The base region may be provided more outside than the first outermost contact region in the direction parallel to the first direction. The base region may have a lower second-conductivity-type doping concentration than the first outermost contact region. In the direction parallel to the first direction, the length of the base region may be shorter than that of the first outermost contact region.

A length $L_a$ may be shorter than a length $L_b$. The length $L_a$ may be a length in the direction parallel to the first direction in the transistor region, between an outer end portion of the first outermost contact region and an outer end portion of a contact hole provided in an interlayer dielectric film and positioned on the first outermost contact region. The length $L_b$ may be a length between an outer end portion of the contact hole on the first outermost contact region and an outer end portion of the accumulation region in the direction parallel to the first direction.

A diode region in direct contact with the transistor region in a second direction orthogonal to the first direction in the front surface of the semiconductor substrate may include a cathode region exposed on the back surface of the semiconductor substrate. A length $L_{1c}$ may be longer than a length $L_{15}$. The length $L_{1c}$ may be a length between an outer end portion of the cathode region and an inner end portion of the first outermost contact region in the direction parallel to the first direction. The length $L_{15}$ may be a length of the first outermost contact region in the direction parallel to the first direction.

The semiconductor substrate may include a diode region. The diode region may be in direct contact with the transistor region in the second direction. The second direction may be orthogonal to the first direction in the front surface of the semiconductor substrate. The diode region may include a first-conductivity-type drift region, a second-conductivity-type base region, an accumulation region and a boundary dummy trench portion. The accumulation region may be provided between the drift region and the base region in the depth direction. The accumulation region may have a higher first-conductivity-type doping concentration than the drift region. The boundary dummy trench portion may be a different trench portion than the plurality of trench portions. The boundary dummy trench portion may be positioned in a boundary region between the transistor region and the diode region. The boundary dummy trench portion may have a dummy conductive portion to receive an emitter potential fed thereto. The accumulation region in the diode region and the boundary mesa region may be positioned more outside in the first direction than the accumulation region in the transistor region excluding the boundary mesa region. The boundary mesa region may be in contact with the boundary dummy trench portion.

The diode region may include a second outermost contact region. The second outermost contact region may be positioned more outside than the base region in the direction parallel to the first direction. The second outermost contact region may have a higher second-conductivity-type doping concentration than the base region. The accumulation region in the diode region and the boundary mesa region may be positioned more outside than the second outermost contact region in the direction parallel to the first direction.

In the direction parallel to the first direction, an outer end portion of the second outermost contact region may be positioned more outside than an outer end portion of the first outermost contact region. In the direction parallel to the first direction, a length $L_{15}'$ of the second outermost contact region may be longer than the length $L_{15}$ of the first outermost contact region.

The diode region may include a cathode region. The cathode region may be exposed on a back surface of the semiconductor substrate. In the direction parallel to the first direction, a length $L_{1c}$ from an outer end portion of the cathode region to an inner end portion of the second outermost contact region is longer than a length $L_{15}'$ of the second outermost contact region.

A length $L_c'$ in the direction parallel to the first direction from the inner end portion of the second outermost contact region to the outer end portion of the accumulation region in the diode region is larger than a length $L_c$ in the direction parallel to the first direction from an inner end portion of the first outermost contact region to the outer end portion of the accumulation region in the transistor region excluding the boundary mesa region.

Note that the summary clause does not necessarily describe all necessary features of the embodiments of the present invention. The present invention may also be a sub-combination of the features described above.

DESCRIPTION OF EXEMPLARY EMBODIMENTS

Hereinafter, although the present invention will be described through embodiments of the invention, the following embodiments shall not limit the claimed invention. Furthermore, not all the combinations of features described in the embodiments are necessarily essential to means provided by aspects of the invention.

In the present specification, one of two sides of a direction parallel with the depth direction of a semiconductor substrate is referred to as an "upper" side and the other side is referred to as a "lower" side. Between two principal surfaces of a substrate, a layer, or another member, one surface is referred to as the upper surface and the other surface is referred to as the lower surface. The "upper" and "lower" directions are not limited to the gravitational direction. Also, in each embodiment, there is shown an example in which the first conductivity type is N type, and the second conductivity type is P type; however, in another embodiment, the first conductivity type may be P type, and the second conductivity type may be N type.

Figure 1:
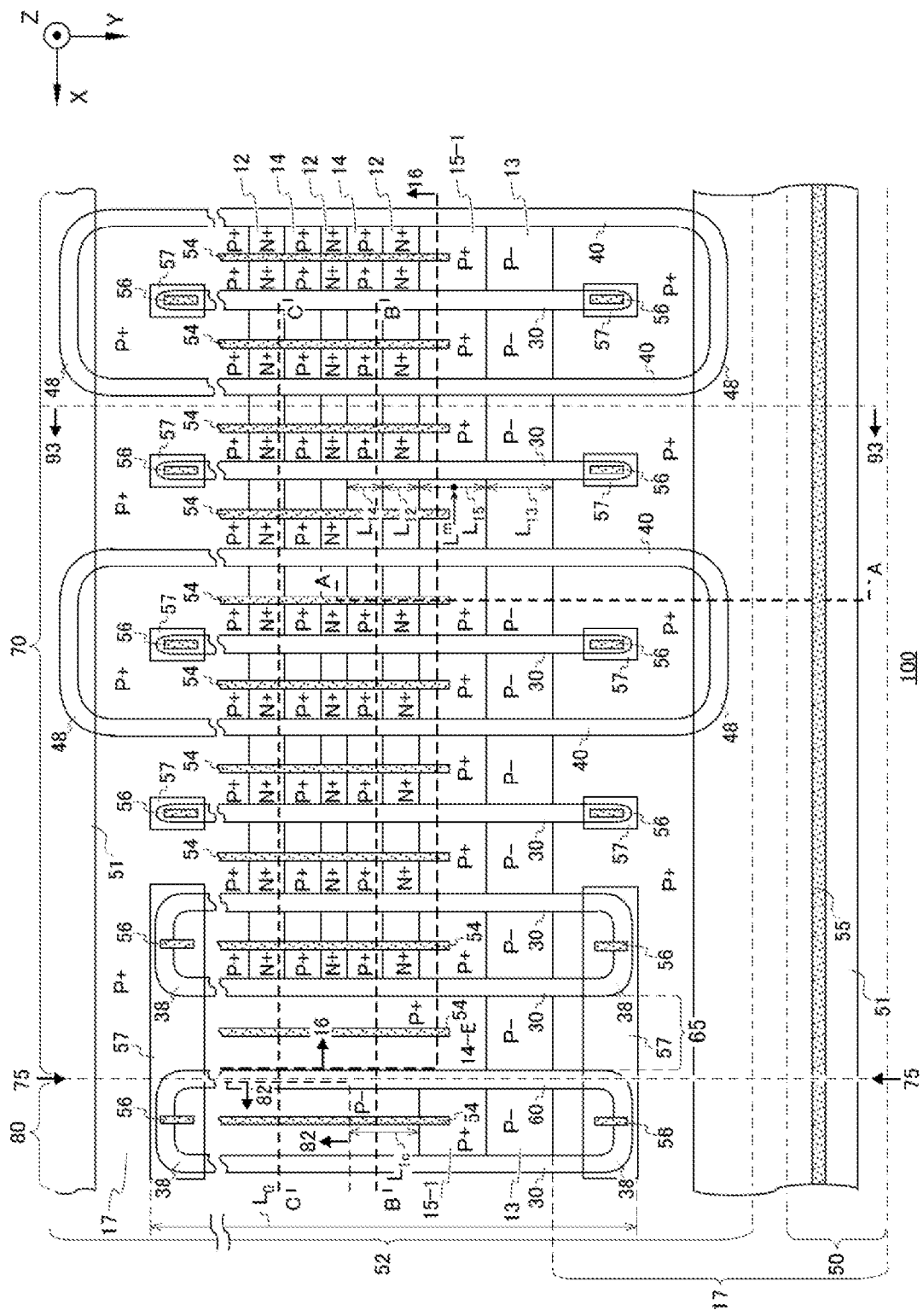
FIG. 1 is a top view of a semiconductor device 100 according to a first embodiment.

FIG. 1 is a top view of a semiconductor device 100 according to a first embodiment. The semiconductor device 100 may be interpreted as a semiconductor chip. The semiconductor device 100 in the present example has a semiconductor substrate. The semiconductor substrate may include a transistor region 70 including a transistor such as an IGBT or the like, and a diode region 80 including a diode such as a FWD (Free Wheeling Diode) or the like. The semiconductor device 100 of the present example is a RC-IGBT (Reverse Conducting—IGBT) in which the IGBT and the FWD are provided in one semiconductor substrate.

In a front surface of the semiconductor substrate, the transistor region 70 and the diode region 80 are in direct contact with each other. The front surface of the semiconductor substrate refers to one of two principal surfaces opposite to each other in the semiconductor substrate. FIG. 1 shows the front surface around an end portion of the semiconductor substrate and does not show the other regions. Note that, as for the gate metal layer 50 and the emitter electrode 52, FIG. 1 only shows their outlines.

FIG. 1 shows an active region of the semiconductor substrate in the semiconductor device 100, and the semiconductor device 100 may have an edge termination structure provided to surround the active region. The active region refers to a region in which a current flows in a thickness direction of the semiconductor substrate. The edge termination structure has a function of relaxing concentration of electric field in the vicinity of the front surface of the semiconductor substrate. The edge termination structure has, for example, a guard ring, a field plate, a RESURF and a combination of these structures.

The semiconductor substrate of the present example has a dummy trench portion 30, a gate trench portion 40, an emitter region 12 of N+ type, a base region 13 of P type, a contact region 14 of P+ type, a first outermost contact region 15-1 of P+ type, an accumulation region 16 of N+ type and a well region 17 of P+ type. Also, the semiconductor device 100 of the present example comprises a gate metal layer 50 and an emitter electrode 52 provided above the front surface of the semiconductor substrate. Note that in FIG. 1, outlines of the gate metal layer 50 and the emitter electrode 52 are shown by dotted lines. The gate metal layer 50 and the emitter electrode 52 are provided to be isolated from each other.

The semiconductor device 100 of the present example has an interlayer dielectric film between the gate metal layer 50 and the emitter electrode 52, and the front surface of the semiconductor substrate. Note that, for the purpose of easy understanding, the interlayer dielectric film will be omitted in FIG. 1. Note that, in the interlayer dielectric film, contact holes 54, 55 and 56 are provided that penetrate through the interlayer dielectric film.

The emitter electrode 52 of the present example is connected via the contact hole 54 to the emitter region 12, the base region 13, the contact region 14 and the first outermost contact region 15-1 on the front surface of the semiconductor substrate. Also, the emitter electrode 52 of the present example is connected to the dummy conductive portion inside the dummy trench portion 30 via the contact hole 56. Therefore, the dummy conductive portion may be referred to as an emitter conductive portion. A connection portion 57 formed of an electrically conductive material such as polysilicon implanted with dopants may be provided between the emitter electrode 52 and the dummy conductive portion. The connection portion 57 may be provided on the front surface of the semiconductor substrate. Though the dummy trench portion 30 is provided under the connection portion 57, all the dummy trench portions 30 are shown by solid lines for the purpose of defining outlines of the dummy trench portions 30.

The gate metal layer 50 of the present example is provided above a gate runner portion 51 to partially overlap the gate runner portion 51. The gate metal layer 50 of the present example is connected to the gate runner portion 51 via the contact hole 55. The gate runner portion 51 of the present example is positioned on the front surface of the semiconductor substrate, and provided between the gate trench portion 40 and the contact hole 55. Note that all the gate trench portions 40 are shown by solid lines for the purpose of defining outlines of the gate trench portions 40. The gate runner portion 51 may be formed of an electrically conductive material such as polysilicon implanted with dopants. On the front surface of the semiconductor substrate, the gate runner portion 51 may be connected to the gate conductive portion inside the gate trench portion 40.

The emitter electrode 52 is formed above the emitter region 12, the base region 13, the contact region 14, the well region 17, the dummy trench portion 30 and the gate trench portion 40. The emitter electrode 52 and the gate metal layer 50 are formed of a material including a metal. For example, each electrode is formed of aluminum or an aluminum-silicon alloy. Each electrode may have a barrier metal formed of, for example, titanium or titanium compound in a lower layer of the region formed of, for example, aluminum. Also, a plug that includes the barrier metal and tungsten provided on the barrier metal may be provided in the contact holes 54, 55 and 56.

In the transistor region 70, the plurality of gate trench portions 40 are arrayed next to each other in the the short direction of the trench portion at predetermined intervals. In the present example, the short direction of the trench portion is defined as the X-axis direction. The X-axis direction is an example of the second direction. The X-axis and the Y-axis are axes orthogonal to each other in the front surface of the semiconductor substrate. Also, the axis orthogonal to the X-axis and the Y-axis is referred to as the Z-axis. Note that as used herein, the Z-axis direction is parallel to the depth direction. The gate conductive portion inside the gate trench portion 40 is electrically connected to the gate metal layer 50 so that the gate potential can be applied to the gate conductive portion.

In the transistor region 70, the plurality of dummy trench portions 30 are arrayed along the short direction at predetermined intervals. The dummy trench portion 30 and the gate trench portion 40 are provided alternately in the X-axis direction except for the vicinity of the boundary region 75. Note that, in the vicinity of the boundary region 75 in the transistor region 70, two dummy trench portions 30 are arrayed along the X-axis direction at predetermined intervals. A potential different from the gate potential is applied to the dummy conductive portion inside the dummy trench portion 30. The dummy conductive portion of the present example is electrically connected to the emitter electrode 52 so that the emitter potential can be applied to the dummy conductive portion.

The plurality of dummy trench portions 30 are provided in the diode region 80. The diode region 80 of the present example has a boundary dummy trench portion 60 positioned at a boundary region 75 between the transistor region 70 and the diode region 80. In FIG. 1, the boundary region 75 is shown by a dashed line. Differently from the dummy trench portion 30 and the gate trench portion 40 provided in the transistor region 70, the boundary dummy trench portion 60 is not in contact with the emitter region 12. Note that the boundary dummy trench portion 60 has the same function and structure as those of the same dummy trench portion 30 in the diode region 80. In view of this point, it is assumed that the boundary dummy trench portion 60 of the present example is included in the diode region 80.

As used herein, there are cases where the dummy trench portion 30, the boundary dummy trench portion 60 and the gate trench portion 40 are referred collectively to as trench portions. Also, in the present example, the longitudinal direction of the trench portion is defined as the Y-axis direction. The Y-axis direction is a direction in which each trench portion extend on the front surface of the semiconductor substrate. Note that the Y-axis direction is an example of the first direction.

The transistor region 70 may occupy a larger area than the diode region 80 does. A length of the transistor region 70 in the X-axis direction may be 500 μm or more and 1500 μm or less. On the other hand, a length of the diode region 80 in the X-axis direction may be 200 μm or more and 500 μm or less. The lengths of the transistor region 70 and the diode region 80 in the Y-axis direction may be the same.

The lengths of the transistor region 70 and the diode region 80 in the Y-axis direction may be longer than a length $L_0$ of the dummy trench portion 30 and the boundary dummy trench portion 60 in the Y-axis direction. Note that the length $L_0$ may be 1000 μm or more and 2000 μm or less. Therefore, a combined region of the transistor region 70 and the diode region 80 may be a rectangular region.

The diode region 80 has a cathode region 82 of N+ type exposed on the back surface of the semiconductor substrate. In FIG. 1, the cathode region 82 is shown by a dotted line. The cathode region 82 may be provided in a partial region in the Y-axis direction. The diode region 80 of the present example has the cathode region 82 at one part in the Y-axis direction, and has a collector region described below at another part at the same depth position as that of the cathode region 82.

In FIG. 1, a length between the end portion of the cathode region 82 in the +Y-axis direction, and the end portion of the first outermost contact region 15-1, provided in the diode region 80, in the −Y-axis direction is shown as a length $L_{1c}$. In FIG. 1, the end portion of the cathode region 82 in the +Y-axis direction may be considered to be the outer end portion of the cathode region 82, and the end portion of the first outermost contact region 15-1 in the −Y-axis direction may be considered to be the inner end portion of the first outermost contact region 15-1. The length $L_{1c}$ is, for example, 200 μm. The length $L_{1c}$ may be longer than the length $L_{15}$ of the first outermost contact region 15-1 in the Y-axis direction ($L_{15} < L_{1c}$). Note that, as to $L_{1c}$, the illustration in FIG. 4 should be also referred to.

The dummy trench portion 30 of the present example has a straight portion that extends in the Y-axis direction. In the straight portions of the two dummy trench portions 30, the ends of the straight portions may be connected to each other through the dummy trench connection portion 38. The dummy trench connection portion 38 may have a curved shape in a top view. The dummy trench connection portion 38 of the present example has a U-shape. Note that the dummy trench connection portion 38 has the same structure as that of the dummy trench portion 30. The dummy trench connection portion 38 may be taken as an extension of the dummy trench portion 30. A boundary between the dummy trench connection portion 38 and the dummy trench portion 30 may be a boundary for convenience of explanation, or the dummy trench connection portion 38 and the dummy trench portion 30 may be actually formed continuously.

In FIG. 1, a dummy trench portion 30 provided to be sandwiched by two gate trench portions 40 in the X-axis direction, among the transistor regions 70, has only straight portions, not having a dummy trench connection portion 38 in a curved line shape. On the other hand, end portions in two dummy trench portions 30 in the diode region 80 are connected through the dummy trench connection portion 38. Similarly, the end portions of the two dummy trench portions 30 that are positioned in the vicinity of the boundary region 75 in the transistor region 70 are also connected through the dummy trench connection portion 38. Note that the shape of the dummy trench portion 30 may not need to be limited to the example of FIG. 1.

The gate trench portion 40 of the present example has a straight portion that extends in the Y-axis direction. In the straight portions of the two gate trench portions 40, the ends of the straight portions may be connected to each other through the gate trench connection portion 48. The gate trench connection portion 48 may have a curved line shape in a top view. The gate trench connection portion 48 of the present example has a U-shape. Note that the gate trench connection portion 48 may have a similar structure to that of the gate trench portion 40. The gate trench connection portion 48 may be taken as an extension of the gate trench portion 40. Similarly to the dummy trench portion 30, a boundary between the gate trench connection portion 48 and the gate trench portion 40 may be a boundary for convenience of explanation.

The gate trench connection portion 48 of the gate trench portion 40 may be positioned closer to the gate runner portion 51 in the Y-axis direction than the dummy trench connection portion 38 of the dummy trench portion 30 is. As mentioned above, the gate conductive portion of the gate trench connection portion 48 positioned at the end of the gate trench portion 40 may be connected to the gate runner portion 51.

The well region 17 is formed in a predetermined range from the end portion of the active region provided with the gate metal layer 50. The well region 17 may be a doping region of the second conductivity type. The well region 17 of the present example is a doping region of P+ type.

In the present example, the end portion of the well region 17 in the Y-axis direction is connected to the end portion of the base region 13. The bottom portion of the well region 17 may be positioned deeper than the bottom portion of the gate trench portion 40 and the bottom portion of the dummy trench portion 30. The partial regions that are of the gate trench portion 40 and the dummy trench portion 30 and that are close to the gate metal layer 50 may be provided in the well region 17. In the present example, at least bottoms of the dummy trench connection portion 38 of the dummy trench portion 30 and the gate trench connection portion 48 of the gate trench portion 40 may be covered with the well region 17 in the depth direction.

In the present example, the trench portion, the well region 17 and the gate runner portion 51 and so on are provided in line symmetry with respect to a predetermined straight line parallel to the X-axis direction in a top view. In the example of FIG. 1, the dummy trench connection portion 38 and the gate trench connection portion 48 positioned on the positive side in the Y-axis direction in the plane of the paper are line-symmetric with the dummy trench connection portion 38 and the gate trench connection portion 48 positioned on the negative side in the Y-axis direction in the plane of the paper, with respect to a predetermined straight line serving as the axis of symmetry. In the present example, in a top view, a position close to an axis of symmetry is referred to as inside, and a position apart from the axis of symmetry is referred to as outside.

In the present example, the base region 13 is provided inside the well region 17 in a direction parallel to the Y-axis direction. In the direction parallel to the Y-axis direction, the base region 13 is exposed on the front surface outside the first outermost contact region 15-1. That is, the base region 13 is exposed on the front surface between the first outermost contact region 15-1 and the well region 17. The base region 13 has a lower doping concentration of P type than the well region 17 or the first outermost contact region 15-1. The base region 13 of the present example is a doping region of P− type.

In the present example, the first outermost contact region 15-1 in the transistor region 70 is the outermost one of the plurality of contact regions 14 in the direction parallel to the Y-axis direction. In the present example, the first outermost contact region 15-1 and one of the contact regions 14 other than the first outermost contact region 15-1 are clearly distinguished from each other in this manner. Note that in the Y-axis direction, the one contact region 14 in the present example refers to a region sandwiched by two emitter regions 12 or a region sandwiched by one emitter region 12 and the first outermost contact region 15-1. Note that both of the contact region 14 and the first outermost contact region 15-1 of the present example are of P+ type and have the same doping concentration. A length of the first outermost contact region 15-1 in the Y-axis direction may be longer than a length of the one contact region 14 in the Y-axis direction. In the present example, the Y-axis length $L_{15}$ of the first outermost contact region 15-1 is longer than the Y-axis length $L_{14}$ of each contact region 14 other than the first outermost contact region 15-1. Note that in the transistor region 70 and the diode region 80 of the present example, the lengths and the positions of the first outermost contact regions 15-1 in the Y-axis direction are the same.

Inside the first outermost contact region 15-1 and between the two adjacent trench portions, the emitter region 12 and the contact region 14 may be provided alternately in the Y-axis direction. Each upper surface of the emitter region 12 and the contact region 14 is exposed on the front surface of the semiconductor substrate. The emitter region 12 may be a doping region of the first conductivity type, or the contact region 14 may be a doping region of the second conductivity type. In the present example, the emitter region 12 is a doping region of N+ type.

In the present example, a length $L_{12}$ in the Y-axis direction of the emitter region 12 exposed on the front surface of the semiconductor substrate is 1.6 μm. Also, in the present example, a length $L_{14}$ in the Y-axis direction of the contact region 14 exposed on the front surface of the semiconductor substrate is 0.6 μm.

The transistor region 70 of the present example has an accumulation region 16 of the first conductivity type in the entire transistor region 70 at a predetermined depth position. The accumulation region 16 of the present example is a doping region of N+ type. In FIG. 1, a range in which the accumulation region 16 is provided is shown by a dashed line. The accumulation region 16 of the present example extends in a direction parallel to the Y-axis direction, and terminates below the first outermost contact region 15-1.

As mentioned above, in a mask for forming the accumulation region 16, a mask sag may occur, or a misalignment of a mask pattern may occur. In a case where the end portion of the mask in the Y-axis direction is set above the base region 13, which is exposed on the front surface, a part of the base region 13 of P− type may be turned into an N type region. As a result, the region turned into the region of N type in the base region 13 can function as the emitter region 12. For this reason, there are cases where the gate threshold voltage of the IGBT may be shifted from the originally designed value.

In the present example, an end portion of the mask in the direction parallel to the Y-axis direction is set above the first outermost contact region 15-1. The first outermost contact region 15-1 of P+ type has a higher P type doping concentration than the base region 13 of P− type. Therefore, even when the N type dopants for formation of the accumulation region 16 are ion implanted into the first outermost contact region 15-1, the first outermost contact region 15-1 is less likely to turn into a region of N type than the base region 13 is. Thus, in the present example, the base region 13 exposed on the front surface is prevented from being unintentionally turned into a region of N type, so that the shifting of the gate threshold voltage from the original design value can be prevented.

The accumulation region 16 may terminate before reaching a middle position $L_m$ of the first outermost contact region 15-1 in the Y-axis direction. That is, the accumulation region 16 may terminate at a position more inside than the middle position $L_m$ of the first outermost contact region 15-1. In this way, with the provision of the accumulation region 16, the turning of a part of the base region 13 into a region of N type can be prevented more securely.

Also, in the present example, the P+ type region can be left surely in the first outermost contact region 15-1, which is positioned more outside than the middle position $L_m$ is. Thus, the remaining first outermost contact region 15-1 can surely extract the holes at the turn-off of the semiconductor device 100. Note that in the present example, a length of the first outermost contact region 15-1 in the Y-axis direction is denoted by $L_{15}$. $L_{15}$ is, for example, 25 μm.

The length $L_{15}$ of the first outermost contact region 15-1 in the Y-axis direction may be 10 times or more longer than the length $L_{14}$ in the Y-axis direction of the contact region 14. $L_{15}$ may be 20 times or more of $L_{14}$, may be 30 times or more thereof, or may be 40 times or more thereof.

In the present example, $L_{15}$ is 25 μm, and $L_{14}$ is 0.6 μm, and thus $L_{15}$ is approximately 42 times of $L_{14}$. Since $L_{15}$ is set sufficiently larger than $L_{14}$, a part of the base region 13 can be prevented from turning into a region of N type, and the first outermost contact region 15-1 of P+ type can be left surely that is capable of extracting the holes.

Also, the accumulation region 16 of the present example extends in the X-axis direction from the transistor region 70 to the diode region 80, and terminates at the boundary dummy trench portion 60. The accumulation region 16 of the present example reaches the trench sidewall that is of the boundary dummy trench portion 60 and that is the closest to the dummy trench portion 30 in the transistor region 70. In this way, as compared to a case where the accumulation region 16 extends beyond the boundary dummy trench portion 60 to reach the diode region 80, migration of the charges from the transistor region 70 to the diode region 80 can be reduced.

A length $L_{13}$ in the Y-axis direction of the base region 13 positioned between the first outermost contact region 15-1 and the well region 17 may be 10 times or more longer than the length $L_{14}$ in the Y-axis direction of the contact region 14. $L_{13}$ may be 20 times or more of $L_{14}$, may be 30 times or more thereof, or may be 40 times or more thereof. In the present example, $L_{13}$ is 25 and $L_{14}$ is 0.6 and thus $L_{13}$ is approximately 42 times of $L_{14}$.

By setting $L_{13}$ sufficiently larger than $L_{14}$, the base region 13 positioned between the first outermost contact region 15-1 and the well region 17 can be functioned as a high resistance region for holes. Accordingly, this configuration can reduce the number of electron-hole pairs accumulated in the edge termination structure when the diode region 80 is energized. Therefore, current crowding from the edge termination structure to the diode region 80 that may occur when the diode region 80 is put in a reverse recovery state can be reduced.

$L_{13}$ may be shorter than $L_{15}$ ($L_{13}<L_{15}$). This configuration can enhance, at turn-off and during reverse recovery and so on, the effect of extracting the holes positioned more outside than the end portion of the contact hole 54 in the longitudinal direction (Y-axis direction). Alternatively, $L_{13}$ may be longer than $L_{15}$ ($L_{15}<L_{13}$). In this case, the concentration of the holes more outside than the longitudinal end portion of the contact hole 54 can be made sufficiently lower than the concentration of the holes below the contact hole 54.

The semiconductor substrate of the present example has a first defect region 93 extending across the diode region 80 and a part of the transistor region 70 in the direction parallel to the X-axis direction. The first defect region 93 is provided at a predetermined depth position in the vicinity of the front surface of the semiconductor substrate. The first defect region 93 has a function of shortening the lifetime of the carriers. Therefore, the first defect region 93 is also referred to as the lifetime killer. As one example, the first defect region 93 is formed by implanting helium ions from the front surface of the semiconductor substrate to a predetermined depth position.

When the first defect region 93 is provided in the entire diode region 80, carrier lifetime in the diode region 80 can be adjusted. For example, carrier lifetime in the diode region 80 can be shortened. In this way, loss during reverse recovery (Eoff) can be reduced. Also, in the present example, the first defect region 93 extends to a position away by 150 μm from the boundary region 75 between the transistor region 70 and the diode region 80 toward the transistor region 70 parallel to the X-axis direction. That is, the first defect region 93 occupies part of the transistor region 70.

In the present example, the first defect region 93 occupies a partial region equivalent to between 10% (=150 μm/1500 μm) of the entire length of the transistor region 70 in the X-axis direction and 30% (=150 μm/500 μm). Accordingly, even when helium ions are implanted from the front surface of the semiconductor substrate, damage to a gate insulating film or the like in the transistor region 70 can be at least partially reduced. Therefore, variation in the gate threshold voltage or the like in the transistor region 70 can be reduced. Also, since ions can be implanted from the front surface of the semiconductor substrate, a depth position into which ions are implanted can be made shallower than when the ions are implanted from the back surface. Therefore, the depth position of the first defect region 93 can be controlled with high accuracy.

The semiconductor substrate has no emitter region 12 in a boundary mesa region 65 between the boundary dummy trench portion 60 and the dummy trench portion 30 provided in the transistor region 70 and closest to the boundary region 75. The base region 13 and the contact region 14 are provided in the boundary mesa region 65. The dummy trench portion 30 closest to the boundary region 75 is one example of the first dummy trench portion 30.

An expansion contact region 14-E provided in the boundary mesa region 65 extend longer than the contact region 14 of the transistor region 70 in the direction parallel to the Y-axis direction. In the present example, the expansion contact region 14-E has the same distance as that from the outside of one first outermost contact region 15-1, separated in the transistor region 70 in the Y-axis direction, to the outside of another first outermost contact region 15-1. The expansion contact region 14-E may be considered to be the result of expanding the contact region 14 in the Y-axis direction. The expansion contact region 14-E may have the same P type doping concentration as the contact region 14.

The emitter electrode 52 is connected to the expansion contact region 14 via the contact hole 54 extending in the Y-axis direction. In this way, as compared to a case where the expansion contact region 14 is not provided, a contact area between the emitter electrode 52 and the contact region 14 can be increased. In the present example, as compared to a case where the expansion contact region 14 is not provided, it is advantageous that holes can be easily extracted at turn-off.

Figure 2:
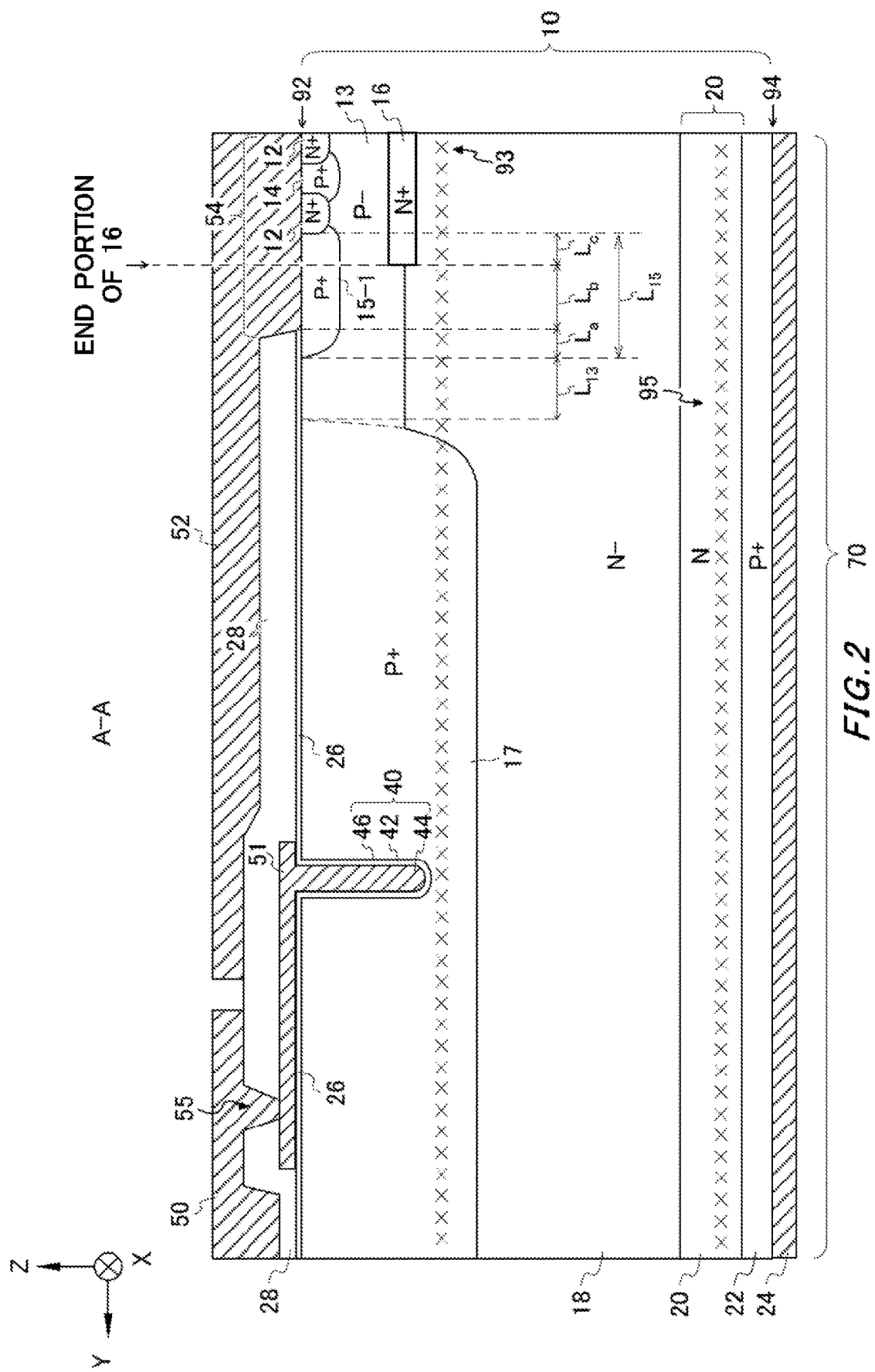
FIG. 2 shows a cross-section A-A in FIG. 1.

FIG. 2 shows a cross-section A-A in FIG. 1. The cross-section A-A is a cross-section that is parallel to the Y-Z plane, and passes through the contact hole 54 that extends in the Y-axis direction. As shown in FIG. 2, the semiconductor device 100 of the present example has a semiconductor substrate 10, an interlayer dielectric film 28, a gate metal layer 50, an emitter electrode 52 and a collector electrode 24. The emitter electrode 52 of the present example is provided on a front surface 92 of the semiconductor substrate 10 and the interlayer dielectric film 28.

Note that a back surface 94 of the semiconductor substrate 10 refers to a surface opposite to the front surface 92. The semiconductor substrate 10 may be a silicon substrate, may be a silicon carbide substrate, or may be a gallium nitride substrate. The collector electrode 24 is provided in contact with the back surface 94 of the semiconductor substrate 10. The collector electrode 24 is formed of a conductive material such as a metal.

The semiconductor substrate 10 includes a collector region 22, a buffer region 20 and a drift region 18. The collector region 22 is a doping region of the second conductivity type. The collector region 22 of the present example is a doping region of P+ type. The lower surface of the collector region 22 may be exposed on the back surface 94 of the semiconductor substrate 10. In the present example, the lower surface of the collector region 22 corresponds to the back surface 94 of the semiconductor substrate 10. The buffer region 20 is provided on the upper surface of the collector region 22.

The buffer region 20 is a doping region of the first conductivity type. The buffer region 20 of the present example has a plurality of peaks of the doping concentration of N type provided discretely in the Z-axis direction. For example, the buffer region 20 has three or more peaks discretely in the Z-axis direction. In one example, when protons are ion implanted from the back surface 94 of the semiconductor substrate 10, the acceleration energy may be adjusted such that different ranges are achieved in the depth direction. In this way, a plurality of N type doping concentration peaks may be formed.

In the present example, the doping concentration of N type in the buffer region 20 is higher than the doping concentration of N type in the drift region 18. Note that the drift region 18 is a doping region of N type positioned at the upper surface of the buffer region 20. The buffer region 20 may function as a field stop layer that prevents a depletion layer that spreads from the lower surface of the base region 13, from reaching the collector region 22 of P+ type and the cathode region of N+ type.

In the vicinity of the boundary between the buffer region 20 and the collector region 22, a second defect region 95 may be provided. In the present example, the second defect region 95 is provided in the buffer region 20 in the vicinity of the boundary. Similarly to the first defect region 93, the second defect region 95 has a function of shortening lifetime of carriers. Note that in FIG. 2, the first defect region 93 and the second defect region 95 are shown with marks of "x."

As one example, the second defect region 95 is formed by implantation of helium ions from the back surface 94 of the semiconductor substrate 10 to a predetermined depth position. The predetermined depth position is, for example, a position of 10 μm above the back surface 94. The predetermined depth position may be an average range in a predetermined acceleration energy.

The well region 17 and the base region 13 are provided on the drift region 18. The well region 17 is provided at a deeper position than that of the base region 13. The well region 17 of the present example is provided from the front surface 92 to a position deeper than the lower end of the trench portion.

The accumulation region 16 has a higher doping concentration of N type than that of the drift region 18. The presence of the accumulation region 16 between the base region 13 and the drift region 18 can enhance the carrier injection-enhancement effect (IE effect) and reduce the ON voltage (Von) of the IGBT. Also, in the present example, the end portion of the accumulation region 16 in the Y-axis direction is provided under the first outermost contact region 15-1 of P+ type; thus, even when the above-mentioned mask sag or the misalignment of the mask pattern occurs, the base region 13 exposed on the front surface 92 can be prevented from being turned unintentionally into a region of N type.

In the present example, the first defect region 93 is provided in the depth direction at a predetermined depth position closer to the accumulation region 16 than the back surface 94 of the semiconductor substrate 10. In FIG. 2, the first defect region 93 is mainly provided in the drift region 18 and the well region 17. The first defect region 93 may be partially overlapped with the accumulation region 16 in the depth direction. With the first defect region 93, the carrier lifetime can be also controlled in the vicinity of the front surface 92 in addition to the vicinity of the back surface 94 of the diode region 80.

Inside the first outermost contact region 15-1 (−Y-axis direction in FIG. 2), the emitter region 12 and the contact region 14 are provided alternately in the Y-axis direction Y. The emitter region 12 and the contact region 14 are provided on the base region 13 in the depth direction. In the present example, the emitter region 12, the base region 13, the accumulation region 16 and the drift region 18 are arranged in the stated order with the emitter region 12 being the closest to the front surface 92. That is, the emitter region 12 and the contact region 14 are provided above the drift region 18.

The interlayer dielectric film 28 is provided on the front surface 92 of the semiconductor substrate 10. The contact hole 54 provided in the interlayer dielectric film 28 extend in the Y-axis direction on the contact region 14 and the emitter region 12. The contact hole 54 of the present example also extends over the first outermost contact region 15-1. In this way, as compared to the case where the contact hole 54 extends only in the contact region 14, it becomes easier to extract the holes at turn-off.

The emitter electrode 52 is connected to the emitter region 12, the contact region 14 and the first outermost contact region 15-1 via the contact hole 54. Note that, as mentioned above, the plug may be provided in the contact hole 54. As compared to a case without the plug, the existence of the plug can reduce contact resistance between the emitter electrode 52, and the contact region 14 and the first outermost contact region 15-1.

The gate trench portion 40 has a gate insulating film 42, a gate conductive portion 44 and a gate trench 46 provided in the vicinity of the front surface 92 of the semiconductor substrate 10. The gate insulating film 42 is formed to cover the inner wall of the gate trench 46. The gate insulating film 42 may be formed by oxidizing or nitriding a semiconductor at the inner wall of the gate trench 46. The gate conductive portion 44 is formed inside the gate insulating film 42 in the interior of the gate trench 46. The gate insulating film 42 insulates the gate conductive portion 44 and the semiconductor substrate 10 from each other. The gate conductive portion 44 is formed of an electrically conductive material such as polysilicon doped with dopants.

The semiconductor device 100 of the present example has an oxide film 26 between the interlayer dielectric film 28 and the front surface 92. The oxide film 26 may be formed concurrently with the oxide film provided in the trench portion. In FIG. 2, the gate insulating film 42 of the gate trench portion 40 and the oxide film 26 on the front surface 92 may be a silicon dioxide film formed by thermal oxidation of the silicon substrate.

The gate runner portion 51 may be provided between the oxide film 26 and the interlayer dielectric film 28 in the Z-axis direction. The gate runner portion 51 may be connected to the gate metal layer 50 via the contact hole 55 provided in the interlayer dielectric film 28.

In the Y-axis direction, the length $L_a$ between the end portion on the gate metal layer 50 side (that is, outside) of the first outermost contact region 15-1 and the outer end portion of the contact hole 54 on the first outermost contact region 15-1 may be shorter than the length $L_b$ between the outer end portion of the contact hole 54 and the outer end portion of the accumulation region 16. Also, in the Y-axis direction, the sum of the length $L_c$ between the outer end portion of the accumulation region 16 and the outer end portion of the outermost emitter region 12, and the above-mentioned length $L_a$ may be shorter than the length $L_b$ ($L_a + L_c < L_b$). The accumulation region 16 has an effect of hindering discharge of holes. Therefore, when $L_b$ is set longer than $L_a$, and further set longer than $L_a + L_c$, an effect of the accumulation region 16 to discharge of holes can be made sufficiently smaller.

Figure 3:
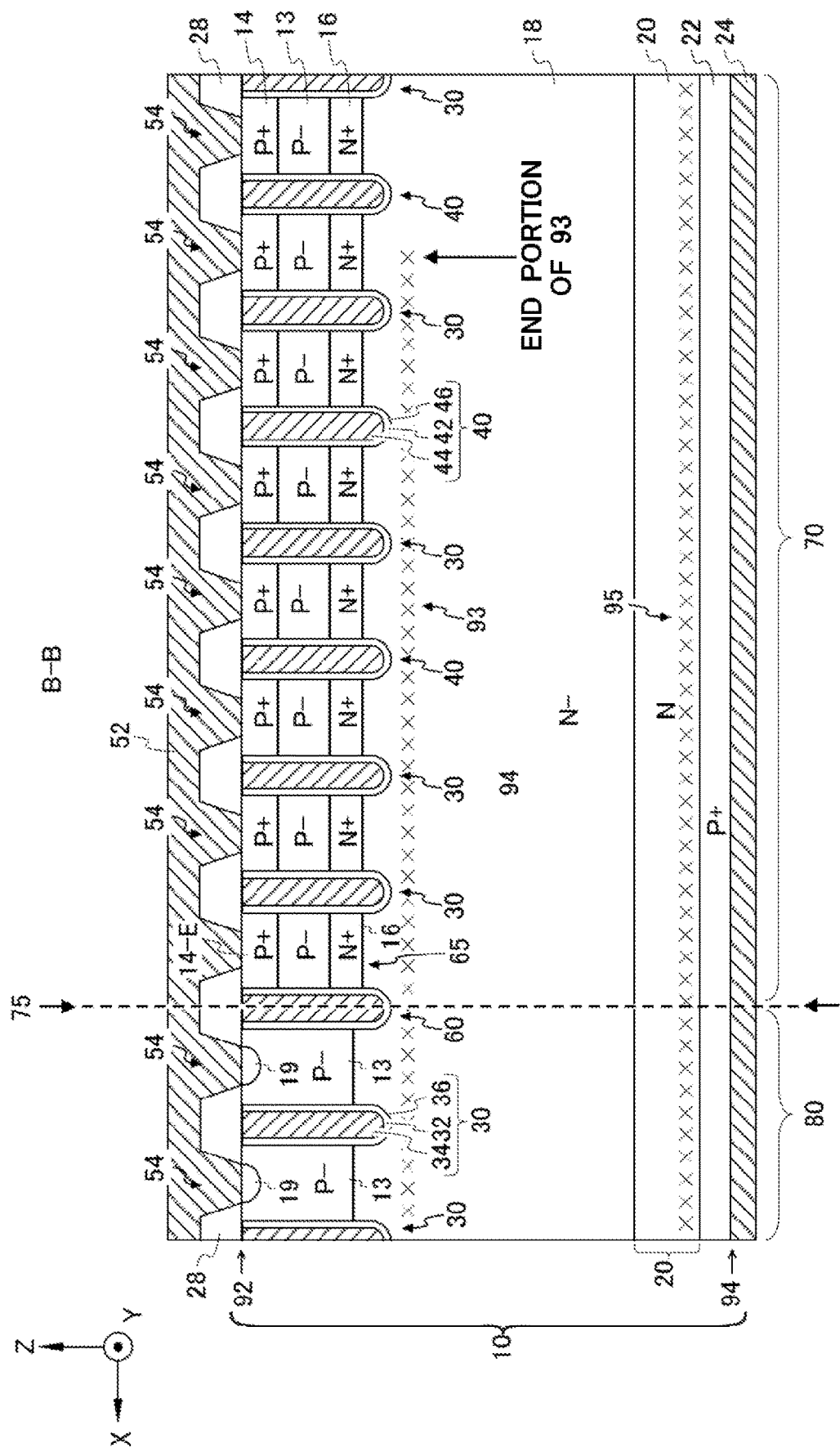
FIG. 3 shows a cross-section B-B in FIG. 1.

FIG. 3 shows a cross-section B-B in FIG. 1. The cross-section B-B is a cross-section that is parallel to the X-Z plane, and passes through the contact region 14 in the transistor region 70. The collector electrode 24, the buffer region 20, the drift region 18 and the second defect region 95 are provided in the transistor region 70 and the diode region 80. In FIG. 3, the collector region 22 of P+ type is provided in the transistor region 70 and the diode region 80.

The trench portion extends from the front surface 92 of the semiconductor substrate 10 in the depth direction to reach the drift region 18. Similarly to the gate trench portion 40, the dummy trench portion 30 and the boundary dummy trench portion 60 each have a dummy trench insulating film 32, a dummy conductive portion 34 and a dummy trench 36. The dummy trench insulating film 32, the dummy conductive portion 34 and the dummy trench 36 each may be formed similarly to the gate insulating film 42, the gate conductive portion 44 and the gate trench 46.

In the present example, a region between individual trench portions in the X-axis direction is referred to as a mesa region. In FIG. 3, the mesa region in the transistor region 70 has the accumulation region 16, the base region 13 and the contact region 14. On the other hand, the mesa region in the diode region 80 has the base region 13 and a high-concentration contact region 19.

In the present example, the high-concentration contact region 19 in the diode region 80 is provided at a shallower position as compared to the contact region 14 in the transistor region 70 in the depth direction. That is, the bottom portion of the high-concentration contact region 19 is closer to the front surface 92 than each bottom portion of the contact region 14 and the first outermost contact region 15-1 in the transistor region 70. The high-concentration contact region 19 may have a higher doping concentration of P type than that of the contact region 14 in the transistor region 70. The high-concentration contact region 19 in the present example is of P++ type. As compared to the contact region 14 of P+ type, the high-concentration contact region 19 of P++ type can reduce contact resistance between anode and the emitter electrode 52 in the diode region 80.

Also, the first defect region 93 is provided in the entire diode region 80 and a part of the transistor region 70 at a predetermined depth position. In the transistor region 70 of the present example, only two gate trench portions 40 have the first defect region 93 below them. Note that the first defect region 93 may be provided from the diode region 80 to an area between the dummy trench portion 30 in the transistor region 70 next closest to the boundary region 75 and the gate trench portion 40 closest to the boundary region 75.

With the provision of the first defect region 93, the gate threshold voltage of the gate trench portion 40 can be varied from a predetermined value. Note that, in the present example, the first defect region 93 is provided only in a part of the transistor region 70, not in the entire transistor region 70. In this way, as the first defect region 93 is provided surely at the entire predetermined depth position in the diode region 80, a region in which the gate threshold voltage is changed from a predetermined value in the transistor region 70 can be reduced.

Figure 4:
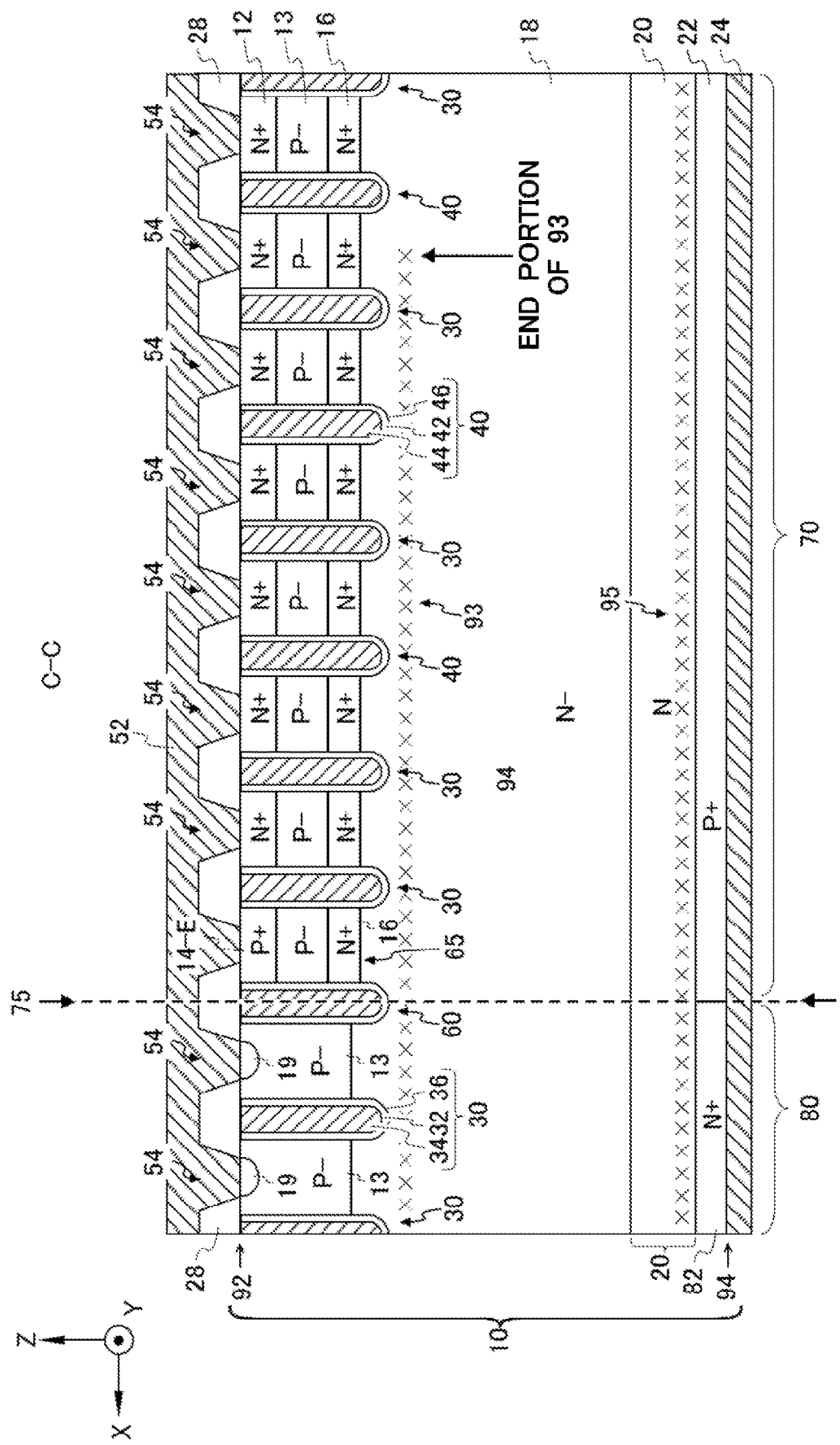
FIG. 4 shows a cross-section C-C in FIG. 1.

FIG. 4 shows a cross-section C-C in FIG. 1. The cross-section C-C is a cross-section that is parallel to the X-Z plane, and passes through the emitter region 12 in the transistor region 70 and the cathode region 82 in the diode region 80. The emitter region 12 is exposed on the front surface 92 in the mesa region between the two trench portions in the transistor region 70. Note that, in the boundary mesa region 65 between the boundary dummy trench portion 60 and the dummy trench portion 30 closest to the boundary region 75, the expansion contact region 14-E is exposed on the front surface 92. Also, the cathode region 82 is provided on the back surface 94 in the diode region 80. The above points are different from those of FIG. 3.

As used herein, the transistor region 70 refers to the region in which the collector region 22 is exposed on the back surface 94 of the semiconductor substrate 10. Here, while the emitter region 12 is exposed on the front surface 92 in the transistor region 70, the expansion contact region 14-E is exposed on the front surface 92 in the boundary mesa region 65 in contact with the boundary dummy trench portion 60. Also, the diode region 80 refers to the region in which the emitter region 12 is not exposed on the front surface 92 of the semiconductor substrate 10 and in which the cathode region 82 is exposed on the back surface 94 of the semiconductor substrate 10. Note that the cathode region 82 is not formed but the collector region 22 is provided in the region near the Y-axis end portions of the diode region 80, but the region may be still considered to be part of the diode region 80.

In FIG. 1, the cathode region 82 may be formed to be sufficiently separated from the first outermost contact region 15-1 in the Y direction. In particular, the length $L_{1c}$ in the Y-axis direction between the position of the end portion on the gate metal layer 50 side of the cathode region 82 and the first outermost contact region 15-1 may be longer than $L_{15}$ ($L_{1c} > L_{15}$). Also, $L_{1c}$ may be longer than 5 times of $L_{15}$ and may be 10 times thereof. Also, $L_{1c}$ may be longer than a value by addition of $L_{13}$ and $L_{15}$ ($L_{1c} > L_{13} + L_{15}$). Alternatively, $L_{1c}$ may be longer than the sum of a carrier diffusion length $L_h$ of holes in the drift region 18, and $L_{15}$ ($L_{1c} > L_h + L_{15}$). Further, the following may be established: $L_{1c} > L_h + L_{15} + L_{13}$.

In the diode region 80, the first outermost contact region 15-1 has a higher concentration than the base region 13, which may cause excessive holes to be injected into the drift region 18. By positioning the cathode region 82 away from the first outermost contact region 15-1, injection of excessive holes from the first outermost contact region 15-1 can be reduced. By setting $L_{1c}$ longer than $L_{15}$, the effect of reducing the hole injection can be further strengthened. By setting $L_{1c}$ longer than $L_{13} + L_{15}$, the influence of the injection from the first outermost contact region 15-1 to the well region 17, which is positioned more outside, can be ignored. When $L_{1c}$ is set longer than $L_h + L_{15}$, the ratio of the length $L_{15}$ of the first outermost contact region 15-1 to $L_{1c}$ can be made sufficiently small, thereby enhancing the effect of reducing the injection of holes.

Figure 5:
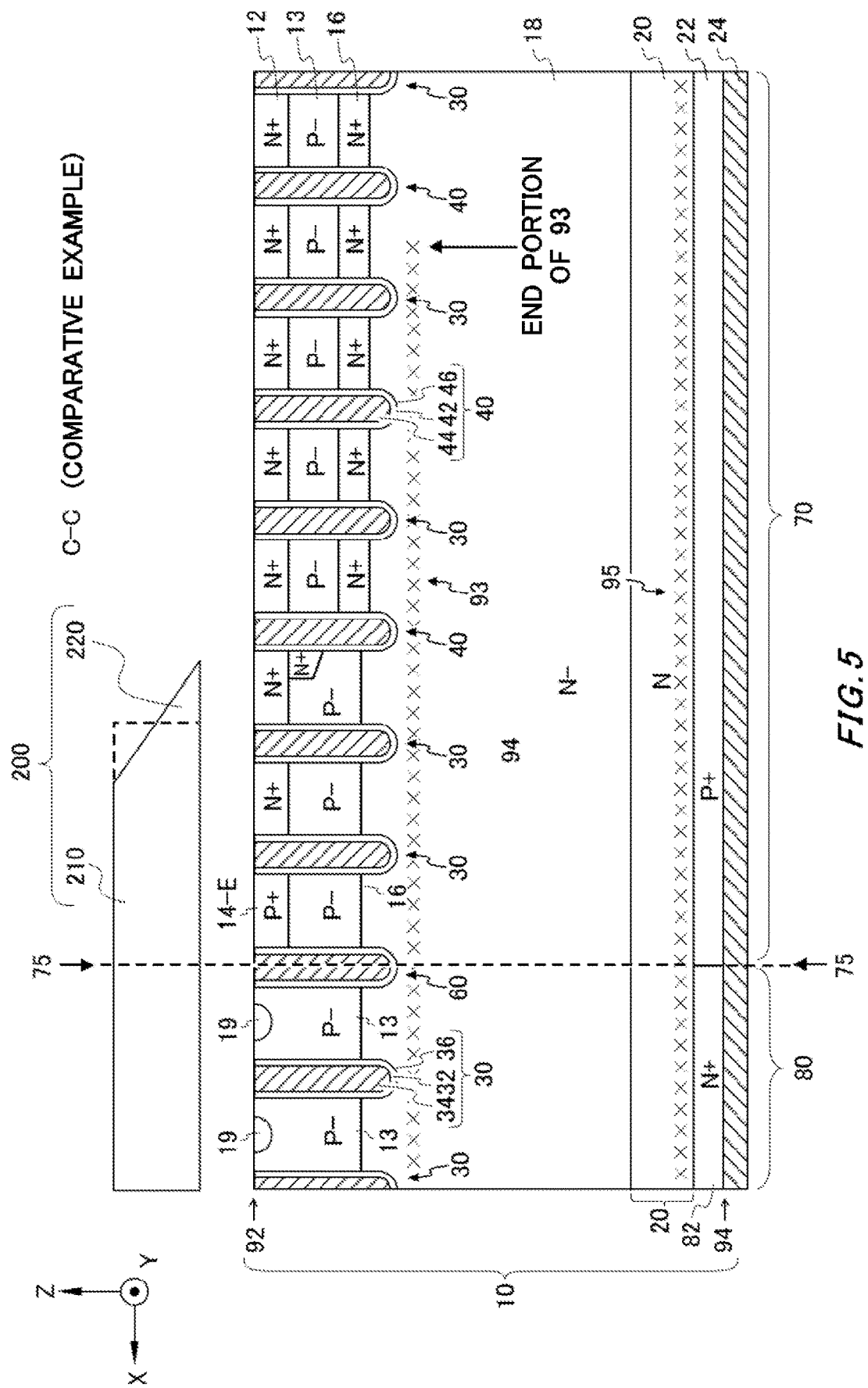
FIG. 5 is a cross-sectional view corresponding to a cross-section C-C in FIG. 1 in a comparative example.

FIG. 5 is a cross-sectional view corresponding to the cross-section C-C in FIG. 1 in a comparative example. FIG. 5 shows in combination a mask 200 to be used in manufacturing of semiconductor device 100. Note that for the purpose of easily seeing the drawing, the structure on the surface 92 will be omitted in FIG. 5. The mask 200 has a main body region 210 with a fixed thickness, and an end portion region 220 which is positioned at an end portion of the mask 200, and in which an upper surface of the end portion of the mask sags downward, and expands horizontally (what is called, mask sag occurs).

The end portion of the mask 200 on the X-Y plane is ideally formed perpendicular to the front surface 92 in the boundary region 75. A position of this ideal end portion is shown by a dashed line. However, when the photoresist is practically used as the material of the mask 200, the mask sag (also referred to as resist sag) can occur at the end portion of the mask 200. In a case where the end portion region 220 in which the mask sag occurs is positioned on the mesa region between the gate trench portion 40 and the dummy trench portion 30, the accumulation region 16 can be formed shallower than a predetermined depth. In one example, as shown in FIG. 5, a region of N+ type is formed between the emitter region 12 and the base region 13 in the depth direction.

On the other hand, in an example of the first embodiment, the mask 200 terminates in the vicinity of the boundary region 75. In this way, the accumulation region 16 is formed at a predetermined depth position in the transistor region 70, while the accumulation region 16 is not formed in the diode region 80. That is, it terminates at the boundary dummy trench portion 60. In this way, variation in gate threshold voltage in the transistor region 70 can be reduced.

Further, in the example of the first embodiment, the expansion contact region 14-E is provided to be exposed on the upper surface of the boundary mesa region 65 in contact with the boundary region 75. In this way, even when the end portion region 220 in which the mask sag occurs is positioned on the boundary region 75, formation of an n type region on the front surface 92 can be prevented. Also, when the formation of this n type region is prevented, it can be prevented that latch-up withstand capability of the semiconductor device 100 is deteriorated. A similar effect can be obtained even in a case where misalignment of mask pattern occurs.

Figure 6:
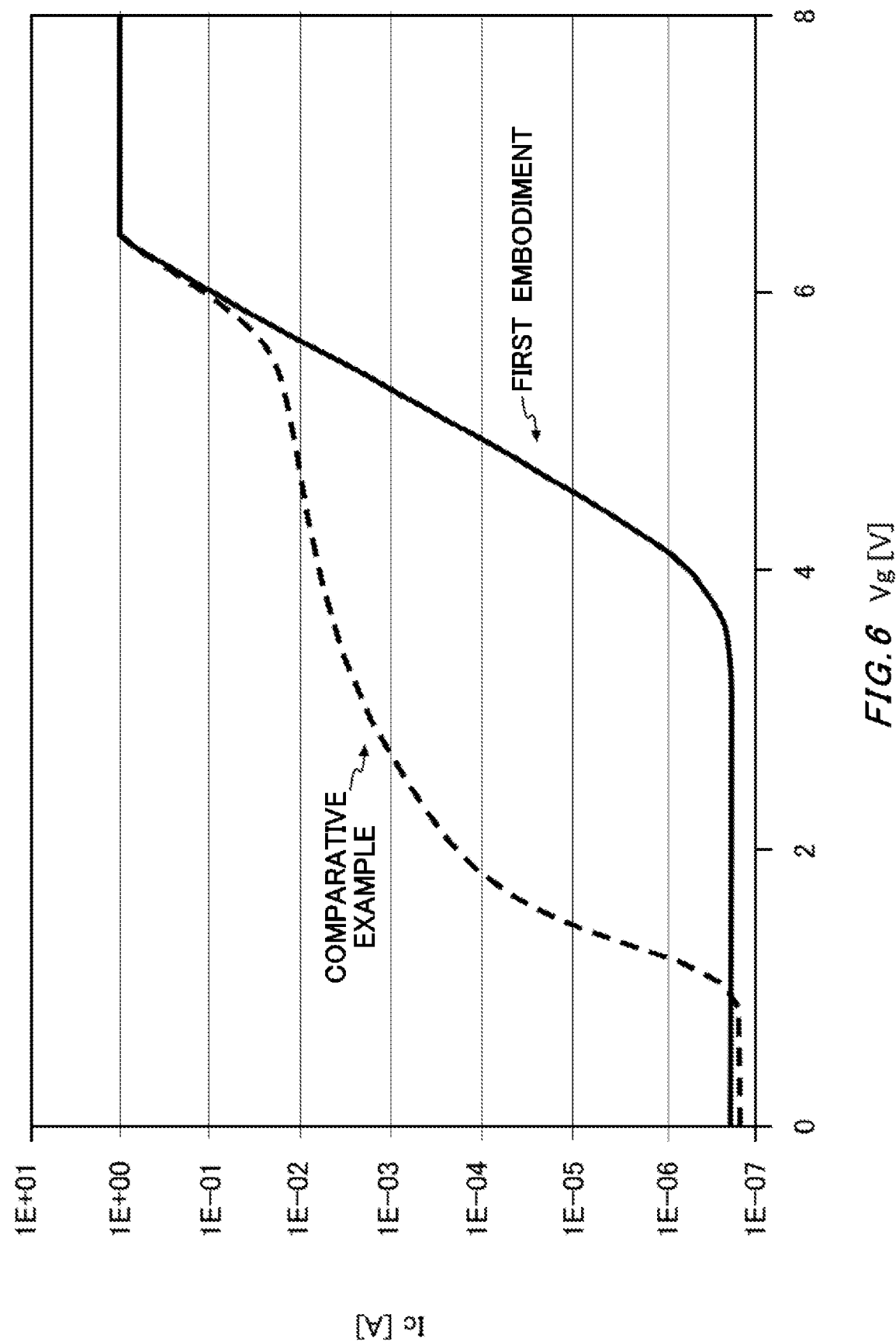
FIG. 6 is a graph showing a simulation result of a collector current Ic to a gate threshold voltage Vg.

FIG. 6 is a graph showing a simulation result of a collector current Ic to a gate threshold voltage Vg. The abscissa is the gate potential Vg [V] to be supplied to the gate metal layer 50. The ordinate is the collector current Ic [A] that flows from the collector electrode 24 to the emitter electrode 52. In the present simulation, the collector current Ic that flowed from the collector electrode 24 to the emitter electrode 52 was measured with increase of the gate potential Vg.

A dashed line is a Vg–Ic curve in the comparative example of FIG. 5. In the comparative example, in Vg=about 1 [V], Ic begins to rise. Then, Ic gently increases from Vg=about 2 [V] to Vg=about 5 [V]. Ic is also a curve that is upward convex in the range of the above-mentioned Vg. Thus, in the comparative example, the gate threshold voltage is hard to be set at a predetermined voltage value. In the comparative example, it can also be said that the gate threshold voltage varies from a predetermined voltage.

A solid line is a Vg–Ic curve in the first embodiment. In the first embodiment, Ic linearly and rapidly increases from Vg=about 4 [V] to Vg=about 6.5 [V]. Thus, in the first embodiment, in a range from Vg=about 4 [V] or more and Vg=about 6.5 [V] or less, the gate threshold voltage can be decided at a predetermined voltage value. In the first embodiment, it can also be said that variation of the gate threshold voltage can be reduced.

Figure 7:
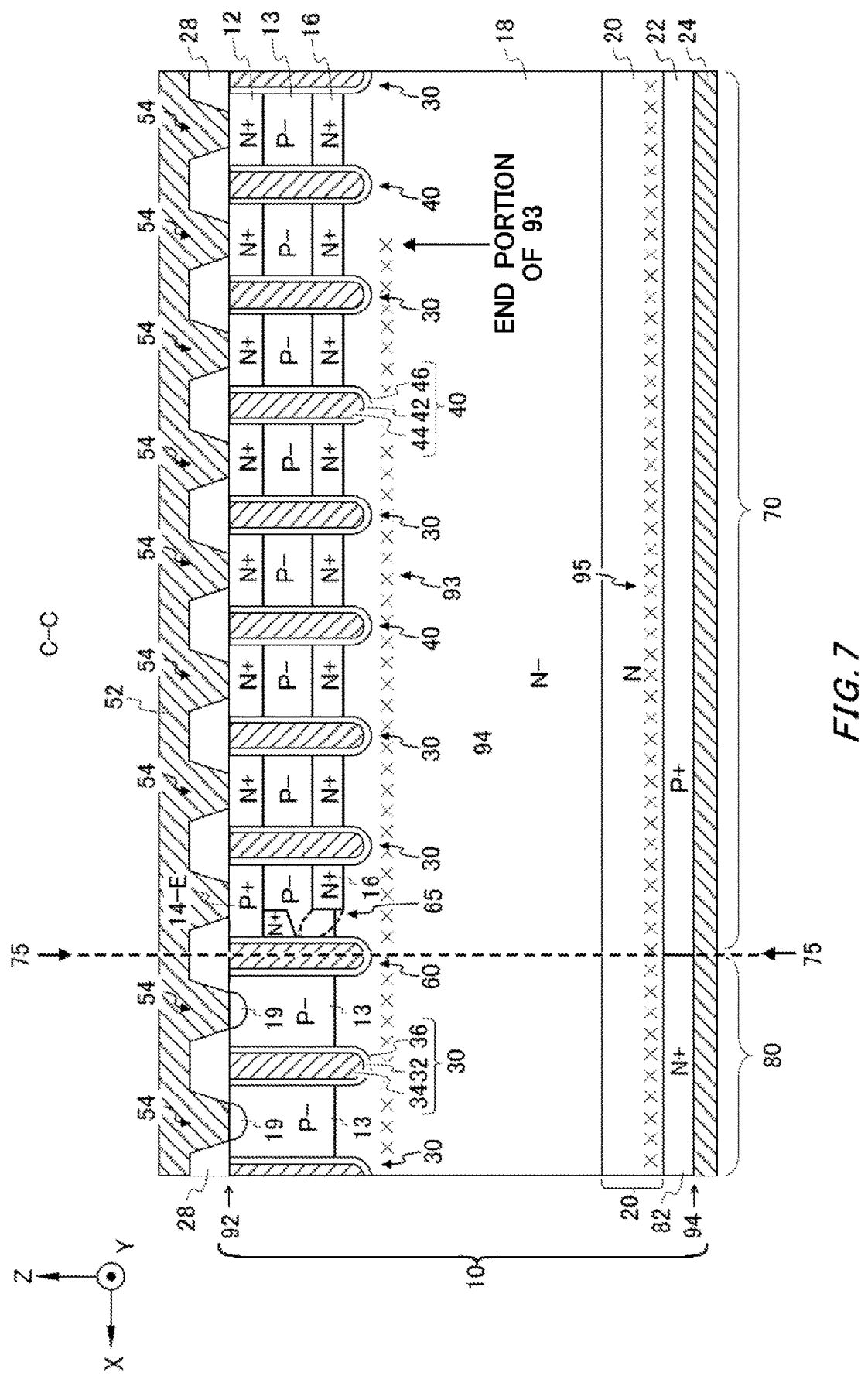
FIG. 7 is a cross-sectional view corresponding to a cross-section C-C in FIG. 1 in a second embodiment.

FIG. 7 is a cross-sectional view corresponding to a cross-section C-C in FIG. 1 in a second embodiment. In the present example, the accumulation region 16 terminates between the dummy trench portion 30 closest to the boundary dummy trench portion 60 and the boundary dummy trench portion 60. That is, the end portion of the accumulation region 16 in the X-axis direction is provided in the boundary mesa region 65 in the transistor region 70 closest to the boundary dummy trench portion 60. The present example is different from the first embodiment in these points.

Also in the present example, since the depth position of the accumulation region 16 in the vicinity of the gate trench portion 40 can be set to a predetermined depth, variation of the gate threshold voltage in the transistor region 70 can be reduced. In addition, in the present example, as compared to a case where the accumulation region 16 is also provided in the diode region 80 as well as in the transistor region 70, migration of charges from the transistor region 70 to the diode region 80 can be reduced. Note that in another example, the end portion region of the accumulation region 16 may become shallower as coming closer to the boundary region 75. That aspect may be shown by a dashed line in FIG. 7. In this way, the end portion region of the accumulation region 16 in the X-axis direction may become shallower serially as coming closer to the boundary region 75.

Figure 8:
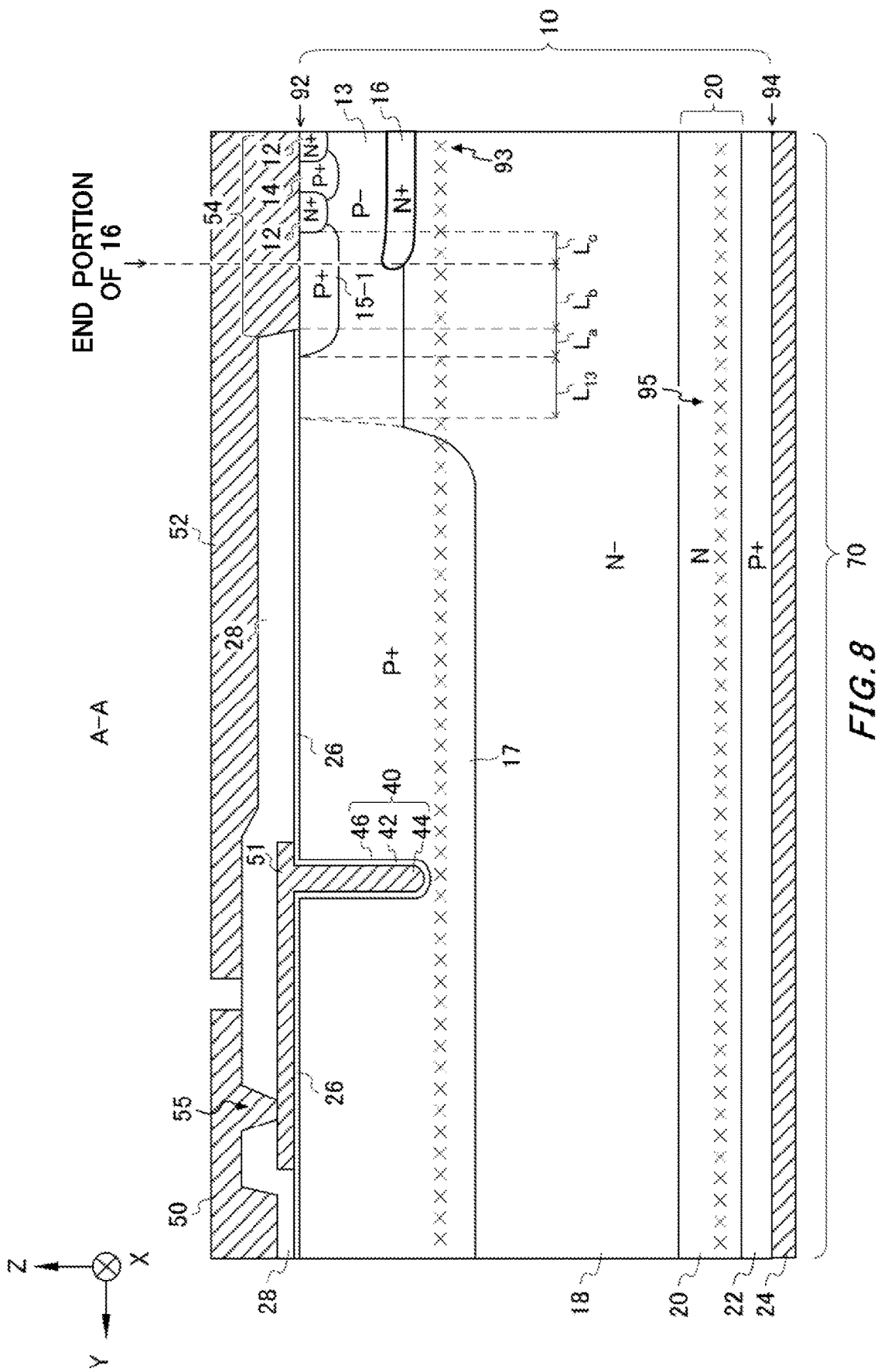
FIG. 8 shows a cross-section A-A of FIG. 1 in a third embodiment.

FIG. 8 shows a cross-section A-A of FIG. 1 in a third embodiment. The end portion of the accumulation region 16 in the Y-axis direction may be shallow below the first outermost contact region 15-1 in the Z-axis direction. That the end portion of the accumulation region 16 in the Y-axis direction is shallow may mean that the peak position of the Y-axis end portion of the accumulation region 16 is closer in the Z-axis direction to the front surface of the semiconductor substrate 10 than the other portion of the accumulation region 16 that is positioned below the region in which the emitter region 12 and the contact region 14 alternate with each other. Further, the relatively shallow Y-axis end portion of the accumulation region 16 may be positioned below the bottom surface of the first outermost contact region 15-1, or below the region having the length $L_b$ extending between the end portion of the contact hole 54 facing the gate metal layer 50 (that is, the outer end portion of the contact hole 54) and the outer end portion of the accumulation region 16. When the end portion of the accumulation region 16 in the Y-axis direction is located at the lower portion of the first outermost contact region 15-1 in the Z-axis direction, it can be prevented that latch-up withstand capability thereof is deteriorated. A similar effect can be obtained even in a case where misalignment of mask pattern occurs.

Figure 9:
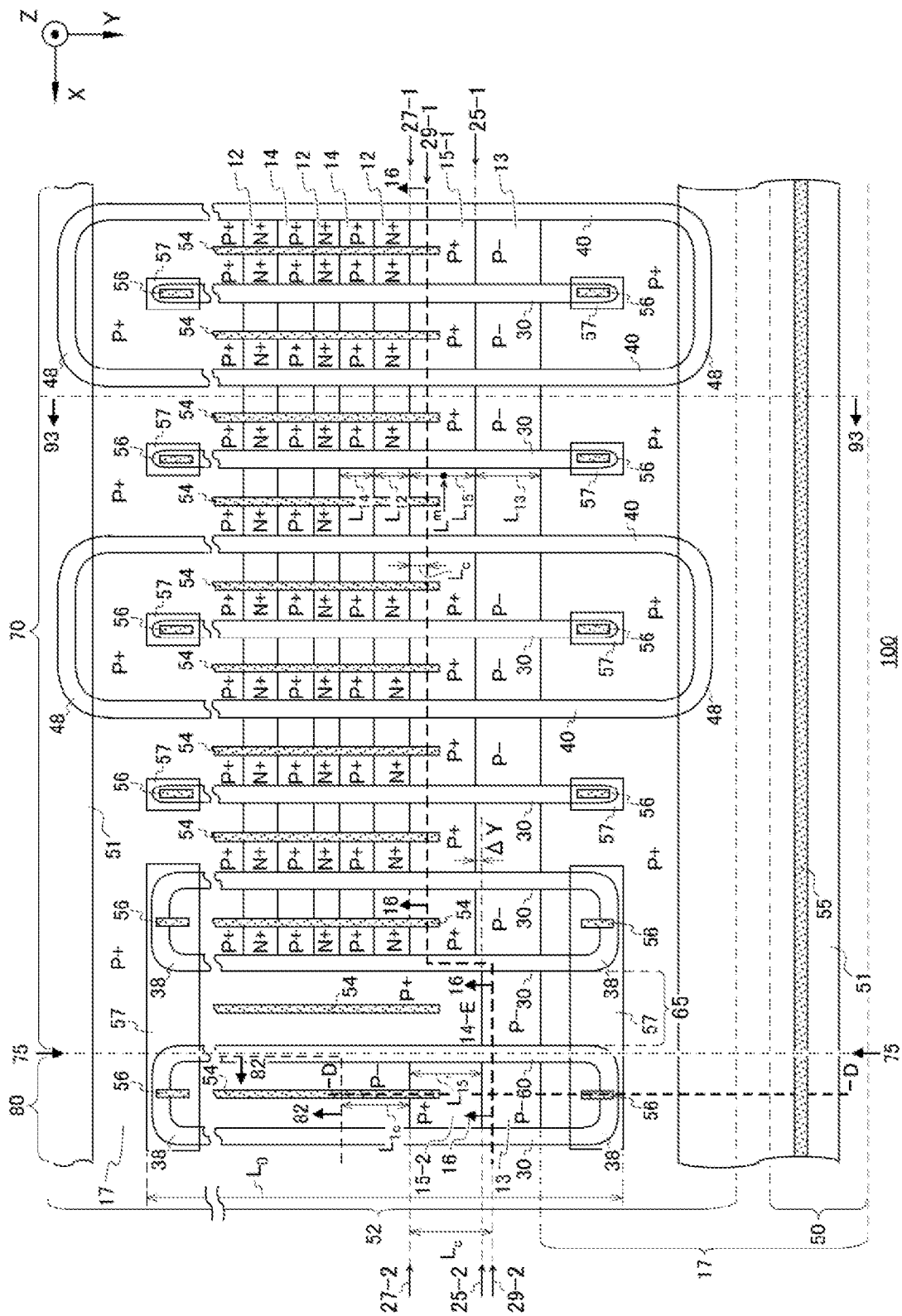
FIG. 9 shows a modification of a diode region 80.

FIG. 9 shows a modification of the diode region 80. In the present example, the accumulation region 16 at the diode region 80 and the boundary mesa region 65 protrudes toward the Y-axis direction from the accumulation region 16 in the transistor region 70. More specifically, an outer end portion 29-2 of the accumulation region 16 in the diode region 80 and the boundary mesa region 65 is positioned more outside in the Y-axis direction than an outer end portion 29-1 of the accumulation region 16 in the transistor region 70 other than the boundary mesa region 65. Note that the boundary mesa region 65 is a mesa region in the transistor region 70 in contact with the boundary dummy trench portion 60.

In the present example, the transistor region 70 (except the boundary mesa region 65) has the first outermost contact region 15-1. On the other hand, the diode region 80 has a second outermost contact region 15-2 that is different in length in the Y-axis direction from the first outermost contact region 15-1 in the transistor region 70. Also, in the present example, the accumulation region 16 at the diode region 80 and the boundary mesa region 65 is positioned more outside than the second outermost contact region 15-2 and the expansion contact region 14-E. That is, in the present example, the accumulation region 16 protrudes outward from the second outermost contact region 15-2 and the expansion contact region 14-E each of which is of P+ type. In this way, in the present example, the accumulation region 16 is provided below the entire X-Y plane of the second outermost contact region 15-2 and the expansion contact region 14-E; thus, excessive injection of holes from these regions of P+ type to the cathode region 82 can be reduced as compared to the first to third embodiments.

In the present example, a position of an inner end portion 27-2 of the second outermost contact region 15-2 coincides with a position of an inner end portion 27-1 of the first outermost contact region 15-1 in the Y-axis direction. On the other hand, an outer end portion 25-2 of the second outermost contact region 15-2 is positioned more outside in the Y-axis direction than an outer end portion 25-1 of the first outermost contact region 15-1. This is shown as $\Delta Y$ in FIG. 9. Also, a length $L_{15}'$ of the second outermost contact region 15-2 is longer than a length $L_{15}$ of the first outermost contact region 15-1 in the Y-axis direction. That is, in a case where widths of individual mesa regions in the X-axis direction are the same in the transistor region 70 and the diode region 80, an area of the second outermost contact region 15-2 is larger than that of the first outermost contact region 15-1.

Note that, in the present example, a length $L_c'$ that is a length in the Y-axis direction from the inner end portion 27-2 of the second outermost contact region 15-2 to the outer end portion 29-2 of the accumulation region 16 in the diode region is larger than a length $L_c$ that is a length in the Y-axis direction from the inner end portion 27-1 of the first outermost contact region 15-1 to the outer end portion 29-1 of the accumulation region 16. In this way, in the present example, excessive injection of holes to the cathode region 82 can be reduced such that an overlapping area between the second outermost contact region 15-2 and the expansion contact region 14-E each of which is of P+ type, and the accumulation region 16 is made larger than an overlapping area between the first outermost contact region 15-1 and the accumulation region 16.

Also, in the present example a length in the Y-axis direction from the outer end portion of the cathode region 82 to the inner end portion 27-2 of the second outermost contact region 15-2 is $L_{1c}$, similarly to the above-mentioned embodiment. Note that, the length $L_{1c}$ is longer than the length $L_{15}'$ of the second outermost contact region 15-2 in the Y-axis direction. Therefore, as compared to a case where the length $L_{1c}$ is shorter than the length $L_{15}'$, the amount of holes that flows from the second outermost contact region 15-2 to the cathode region 82 can be reduced.

Figure 10:
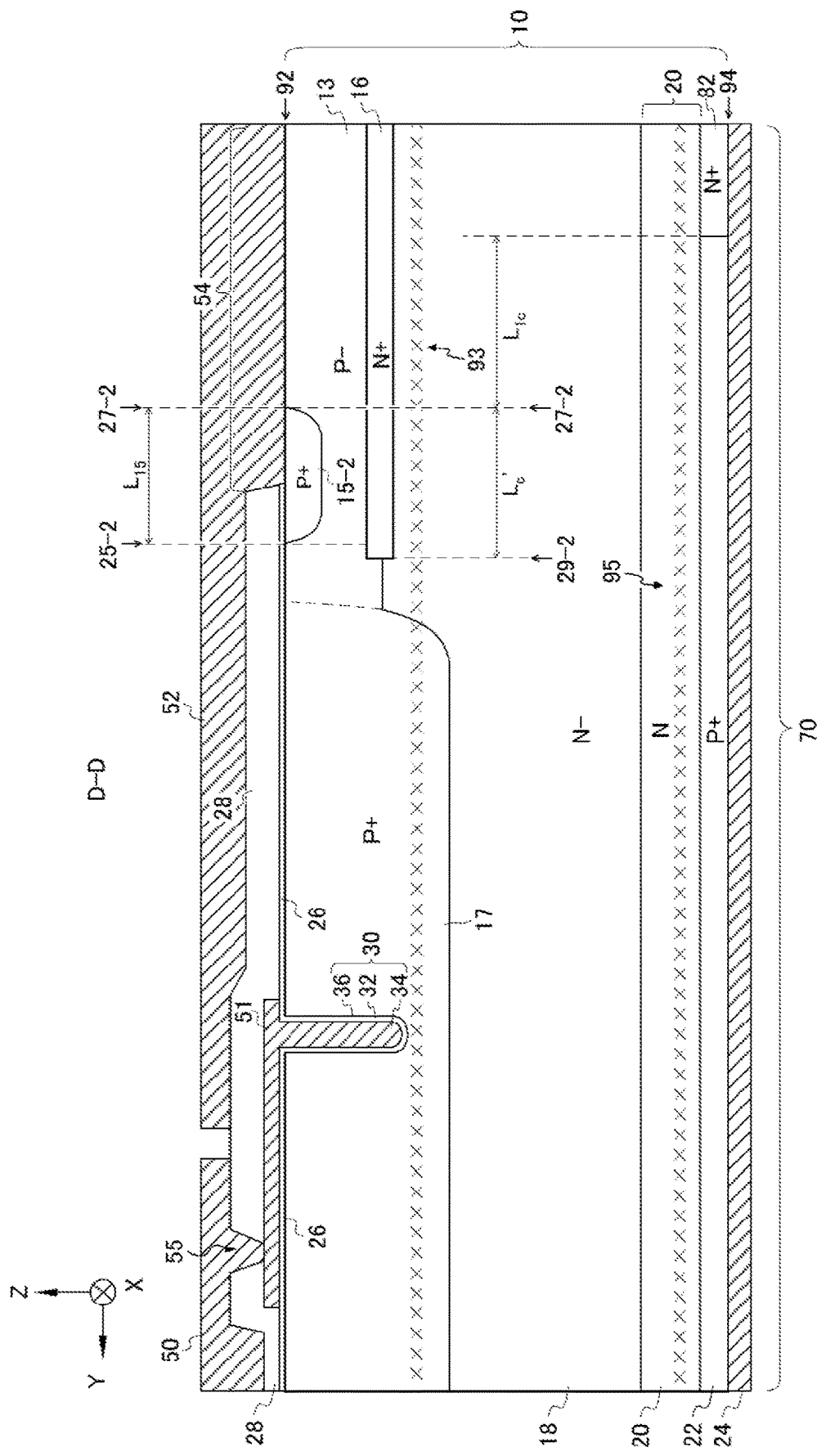
FIG. 10 shows a cross-section D-D in FIG. 9.

FIG. 10 shows a cross-section D-D in FIG. 9. The cross-section D-D is a cross-section that is parallel to the Y-Z plane, and passes through the contact hole 54 that extends in the diode region 80 in the Y-axis direction. In FIG. 10, the cathode region 82, the length $L_{15}'$ of the second outermost contact region 15-2, the length $L_c'$ from the inner end portion 27-2 of the second outermost contact region 15-2 to the outer end portion 25-2 of the accumulation region 16 and the length $L_{1c}$ in the Y-axis direction between the outer end portion of the cathode region 82 and the inner end portion 27-2 of the second outermost contact region 15-2 are clearly specified. Note that the length $L_{15}'$ of the diode region 80 is larger than the length $L_{15}$ of the transistor region 70, and the length $L_c'$ of the diode region 80 is larger than the length $L_c$ of the transistor region 70. Note that the mesa region in the diode region 80 in the present example does not have the high-concentration contact region 19 of P++ type immediately under the contact hole 54. Note that, similarly to the first to third embodiments, the mesa region of the diode region 80 may have the high-concentration contact region 19.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 12 . . . emitter region, 13 . . . base region, 14 . . . contact region, 14-E . . . expansion contact region, 15 . . . outermost contact region, 16 . . . accumulation region, 17 . . . well region, 18 . . . drift region, 19 . . . high-concentration contact region, 20 . . . buffer region, 22 . . . collector region, 24 . . . collector electrode, 25 . . . end portion, 26 . . . oxide film, 27 . . . end portion, 28 . . . interlayer dielectric film, 29 . . . end portion, 30 . . . dummy trench portion, 32 . . . dummy trench insulating film, 34 . . . dummy conductive portion, 36 . . . dummy trench, 38 . . . dummy trench connection portion, 40 . . . gate trench portion, 42 . . . gate insulating film, 44 . . . gate conductive portion, 46 . . . gate trench, 48 . . . gate trench connection portion, 50 . . . gate metal layer, 51 . . . gate runner portion, 52 . . . emitter electrode, 57 . . . connection portion, 54, 55, 56 . . . contact hole, 60 . . . boundary dummy trench portion, 65 . . . boundary mesa region, 70 . . . transistor region, 75 . . . boundary region, 80 . . . diode region, 82 . . . cathode region, 92 . . . front surface, 93 . . . first defect region, 94 . . . back surface, 95 . . . second defect region, 100 . . . semiconductor device, 200 . . . mask, 210 . . . main body region, 220 . . . end portion region

What is claimed is:

1. A semiconductor device including a semiconductor substrate,
the semiconductor substrate having a transistor region, the transistor region comprising:
a first-conductivity-type drift region;
a plurality of trench portions extending from a front surface of the semiconductor substrate in a depth direction to reach the drift region and extending in a first direction on the front surface;
a plurality of first-conductivity-type emitter regions and a plurality of second-conductivity-type contact regions provided above the drift region and each having an upper surface exposed on the front surface, the plurality of emitter regions and the plurality of contact regions being alternately arranged next to each other in the first direction between two adjacent trench portions of the plurality of trench portions; and
an accumulation region provided between the drift region and the plurality of emitter regions in the depth direction, and having a higher first-conductivity-type doping concentration than the drift region,
wherein a first outermost contact region is an outermost one of the plurality of contact regions in a direction parallel to the first direction, and is longer in the first direction than one contact region of the plurality of contact regions other than the first outermost contact region, and
the accumulation region terminates at a position below the first outermost contact region.

2. The semiconductor device according to claim 1, wherein the accumulation region extends in the direction parallel to the first direction and terminates before reaching a middle position of the first outermost contact region in the first direction.

3. The semiconductor device according to claim 1, wherein a length in the first direction of the first outermost contact region is 10 times or more longer than a length in the first direction of the one contact region of the plurality of contact regions other than the first outermost contact region.

4. The semiconductor device according to claim 1, further comprising an interlayer dielectric film provided on the front surface of the semiconductor substrate,
- wherein a contact hole provided in the interlayer dielectric film is positioned on the plurality of contact regions and the plurality of emitter regions and extends in the first direction to reach a region above the first outermost contact region.

5. The semiconductor device according to claim 1,
- wherein the semiconductor substrate includes a base region that is provided more outside than the first outermost contact region in the direction parallel to the first direction and that has a lower second-conductivity-type doping concentration than the first outermost contact region, and
- a length in the first direction of the base region is 10 times or more longer than a length in the first direction of the one contact region of the plurality of contact regions other than the first outermost contact region.

6. The semiconductor device according to claim 1, wherein the semiconductor substrate comprises a diode region adjacent to the transistor region in a second direction orthogonal to the first direction in the front surface of the semiconductor substrate,
- the diode region includes a boundary dummy trench portion that is a different trench portion than the plurality of trench portions, and the boundary dummy trench portion is positioned in a boundary region between the transistor region and the diode region and includes a dummy conductive portion to receive an emitter potential fed thereto,
- the plurality of trench portions includes (i) a plurality of dummy trench portions each having a dummy conductive portion to receive the emitter potential fed thereto and (ii) a plurality of gate trench portions each having a gate conductive portion to receive a gate potential fed thereto, and
- the accumulation region extends in the second direction from the transistor region to the diode region, and terminates in the boundary dummy trench portion or in a region between the boundary dummy trench portion and a first dummy trench portion of the plurality of dummy trench portions that is the closest to the boundary dummy trench portion.

7. The semiconductor device according to claim 6,
- wherein the semiconductor substrate further includes, in a boundary mesa region between the boundary dummy trench portion and the first dummy trench portion, a second-conductivity-type expansion contact region that does not have the plurality of emitter regions and that extends longer in the direction parallel to the first direction extends than the plurality of contact regions.

8. The semiconductor device according to claim 6,
- wherein the drift region includes a first defect region positioned closer to the accumulation region than to a back surface of the semiconductor substrate in the depth direction, the first defect region extends in a direction parallel to the second direction across the diode region and a part of the transistor region, and the first defect region is designed to shorten a lifetime of a carrier.

9. The semiconductor device according to claim 6,
- wherein the diode region of the semiconductor substrate includes a high-concentration contact region that is provided at a shallower position than the plurality of contact regions in the depth direction, and the high-concentration contact region has a higher second-conductivity-type doping concentration than the plurality of contact regions.

10. The semiconductor device according to claim 1,
- wherein the semiconductor substrate includes a base region that is positioned more outside than the first outermost contact region in the direction parallel to the first direction and that has a lower second-conductivity-type doping concentration than the first outermost contact region, and
- in the direction parallel to the first direction, a length of the base region is shorter than a length of the first outermost contact region.

11. The semiconductor device according to claim 1,
- wherein, in the direction parallel to the first direction in the transistor region, a length $L_a$ between an outer end portion of the first outermost contact region and an outer end portion of a contact hole provided in an interlayer dielectric film and positioned on the first outermost contact region is shorter than a length $L_b$ between the outer end portion of the contact hole positioned on the first outermost contact region and an outer end portion of the accumulation region in the direction parallel to the first direction.

12. The semiconductor device according to claim 1,
- wherein a diode region is adjacent to the transistor region in a second direction orthogonal to the first direction in the front surface of the semiconductor substrate and includes a cathode region that is exposed on a back surface of the semiconductor substrate, and
- in the direction parallel to the first direction, a length $L_{1c}$ between an outer end portion of the cathode region and an inner end portion of the first outermost contact region is longer than a length $L_{15}$ of the first outermost contact region.

13. The semiconductor device according to claim 1,
- wherein the semiconductor substrate comprises a diode region that is adjacent to the transistor region in a second direction orthogonal to the first direction in the front surface of the semiconductor substrate,
- the diode region comprises:
- a first-conductivity-type drift region;
- a second-conductivity-type base region;
- an accumulation region provided between the drift region and the base region in the depth direction and having a higher first-conductivity-type doping concentration than the drift region; and
- a boundary dummy trench portion that is a different trench portion than the plurality of trench portions, the boundary dummy trench portion being positioned in a boundary region between the transistor region and the diode region and having a dummy conductive portion to receive an emitter potential fed thereto, and
- the accumulation region in the diode region and a boundary mesa region in contact with the boundary dummy trench portion is positioned more outside in the first direction than the accumulation region in the transistor region excluding the boundary mesa region.

14. The semiconductor device according to claim 13,
- wherein the diode region includes a second outermost contact region that is positioned more outside than the base region in the direction parallel to the first direction and that has a higher second-conductivity-type doping concentration than the base region, and
- the accumulation region in the diode region and the boundary mesa region is positioned more outside than the second outermost contact region in the direction parallel to the first direction.

15. The semiconductor device according to claim 14,
wherein in the direction parallel to the first direction, an outer end portion of the second outermost contact region is positioned more outside than an outer end portion of the first outermost contact region, and in the direction parallel to the first direction, a length $L_{15}'$ of the second outermost contact region is longer than the length $L_{15}$ of the first outermost contact region.

16. The semiconductor device according to claim 15,
wherein the diode region includes a cathode region that is exposed on a back surface of the semiconductor substrate, and in the direction parallel to the first direction, a length $L_{1c}$ from an outer end portion of the cathode region to an inner end portion of the second outermost contact region is longer than the length $L_{15}'$ of the second outermost contact region.

17. The semiconductor device according to claim 14,
wherein in the direction parallel to the first direction, a length $L_c'$ from an inner end portion of the second outermost contact region to an outer end portion of the accumulation region in the diode region is larger than a length $L_c$, in the direction parallel to the first direction, from an inner end portion of the first outermost contact region to the outer end portion of the accumulation region in the transistor region excluding the boundary mesa region.

* * * * *